United States Patent
Hashimoto et al.

(10) Patent No.: US 7,208,774 B2
(45) Date of Patent: Apr. 24, 2007

(54) SEMICONDUCTOR OPTICAL DEVICE

(75) Inventors: Jun-ichi Hashimoto, Yokohama (JP); Tsukuru Katsuyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 129 days.

(21) Appl. No.: 11/152,789

(22) Filed: Jun. 15, 2005

(65) Prior Publication Data
US 2005/0280021 A1    Dec. 22, 2005

(30) Foreign Application Priority Data
Jun. 17, 2004   (JP)   ............... P2004-180078

(51) Int. Cl.
*H01L 29/24*   (2006.01)
(52) U.S. Cl. ............... 257/102; 257/103; 257/E33.023; 257/E33.024
(58) Field of Classification Search ................ 257/102, 257/103, E33.023, E33.024
See application file for complete search history.

(56) References Cited

U.S. PATENT DOCUMENTS

| | | | | |
|---|---|---|---|---|
| 5,805,630 | A * | 9/1998 | Valster et al. ............. | 372/50.12 |
| 6,631,148 | B1 * | 10/2003 | Fukuhisa et al. ......... | 372/43.01 |
| 2004/0119080 | A1 * | 6/2004 | Hashimoto et al. ........... | 257/85 |
| 2005/0067630 | A1 * | 3/2005 | Zhao ......................... | 257/134 |
| 2005/0220158 | A1 * | 10/2005 | Koyama et al. ......... | 372/43.01 |
| 2006/0078022 | A1 * | 4/2006 | Kozaki et al. ........... | 372/43.01 |

FOREIGN PATENT DOCUMENTS

JP       03-020724        1/1991

OTHER PUBLICATIONS

Nelson, et al., CW Electrooptical Properties of InGaAsP ($\lambda$=1.3 μm Buried-Heterostructure Lasers, IEEE Journal of Quantum Electronics, vol. QE-17, No. 2, Feb. 1981, pp. 202-207.
Osinski, et al., Threshold Current Analysis of Compressive Strain (0-1.8%) in Low- Threshold, Long-Wavelength Quantm Well Lasers, IEEE Journal of Quantum Electronics, vol. 29, No. 6, Jun. 1993, pp. 1576-1585.

* cited by examiner

*Primary Examiner*—Ngân V. Ngô
(74) *Attorney, Agent, or Firm*—Smith, Gambrell & Russell, LLP

(57) ABSTRACT

In a semiconductor optical device, a first conductive type semiconductor region is provided on a surface of GaAs. The first conductive type semiconductor region has a first region and a second region. An active layer is provided on the first region of the first conductive type semiconductor region. The active layer has a pair of side surfaces. A second conductive type semiconductor region is provided on the sides and top of the active layer, and the second region of the first conductive type semiconductor region. The bandgap energy of the first conductive type semiconductor region is greater than that of the active layer. The bandgap energy of the second conductive type semiconductor region is greater than that of the active layer. The second region of the first conductive type semiconductor region and the second conductive type semiconductor region constitute a pn junction.

19 Claims, 17 Drawing Sheets

Fig.2
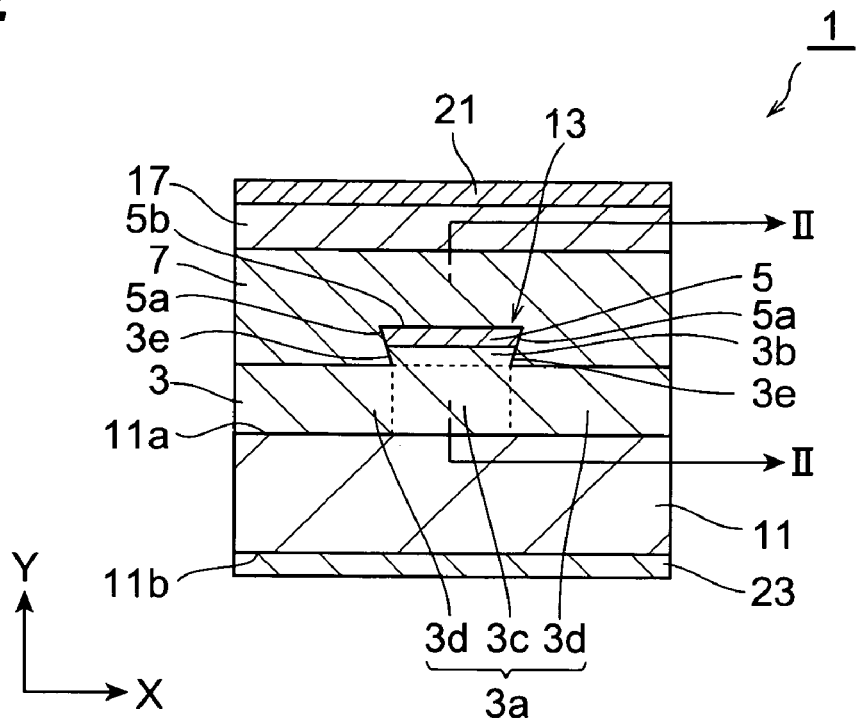
(a)
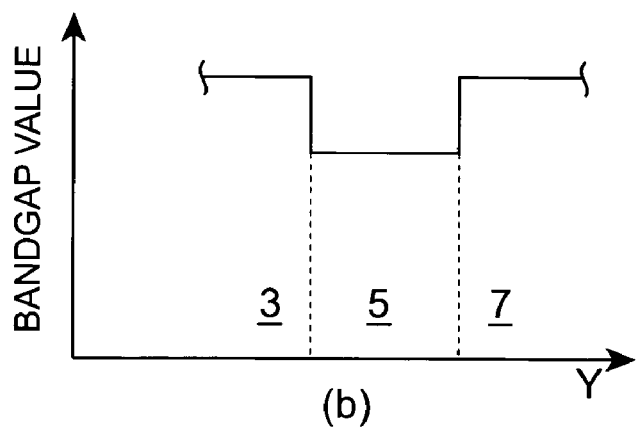
(b)
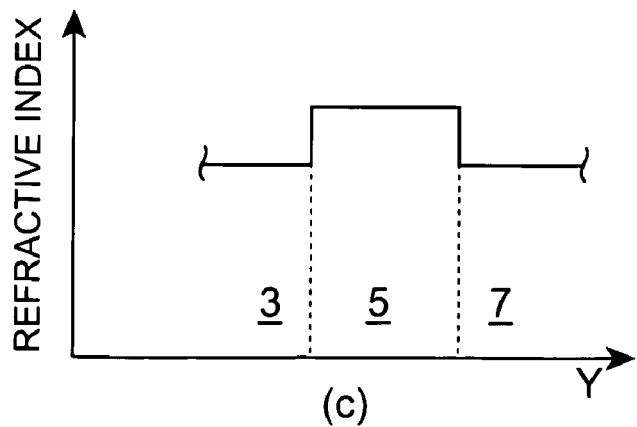
(c)

Fig.7
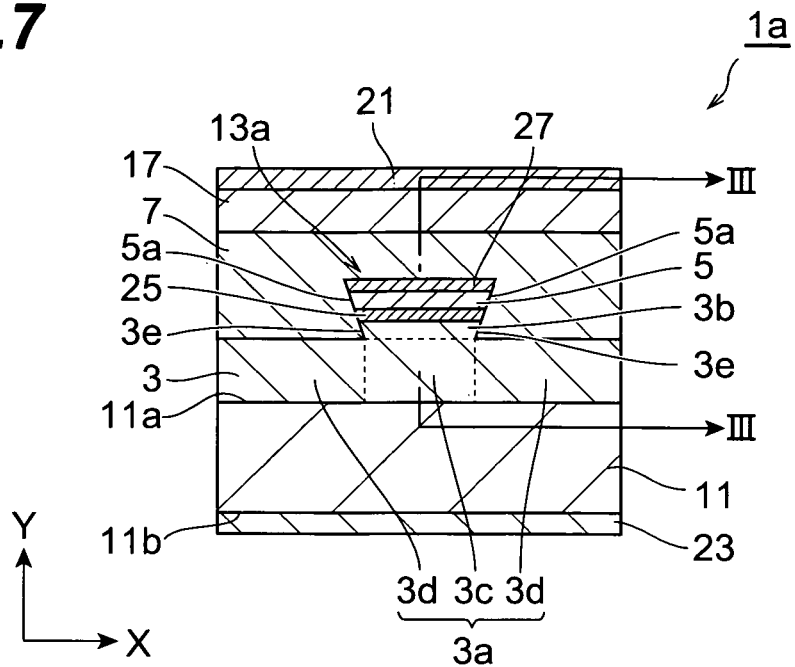
(a)
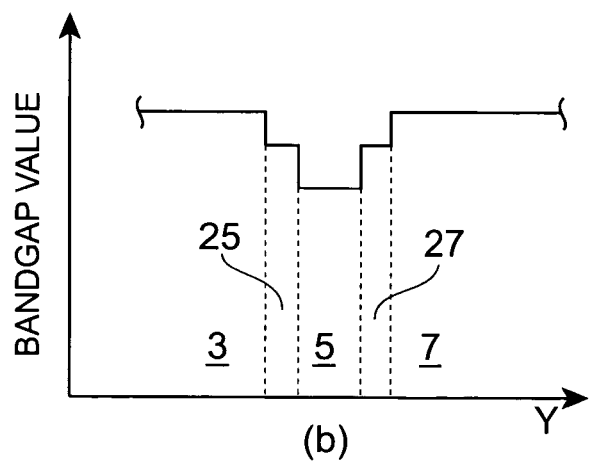
(b)
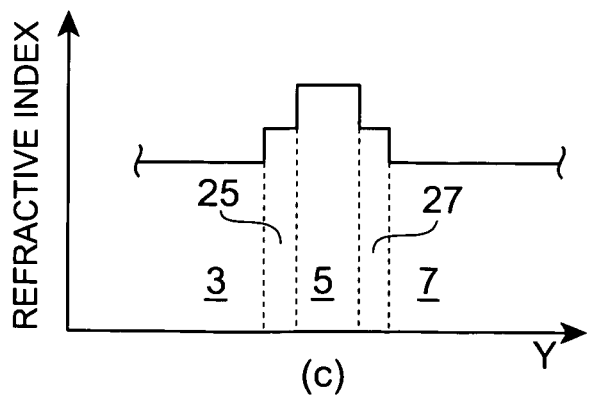
(c)

Fig.9
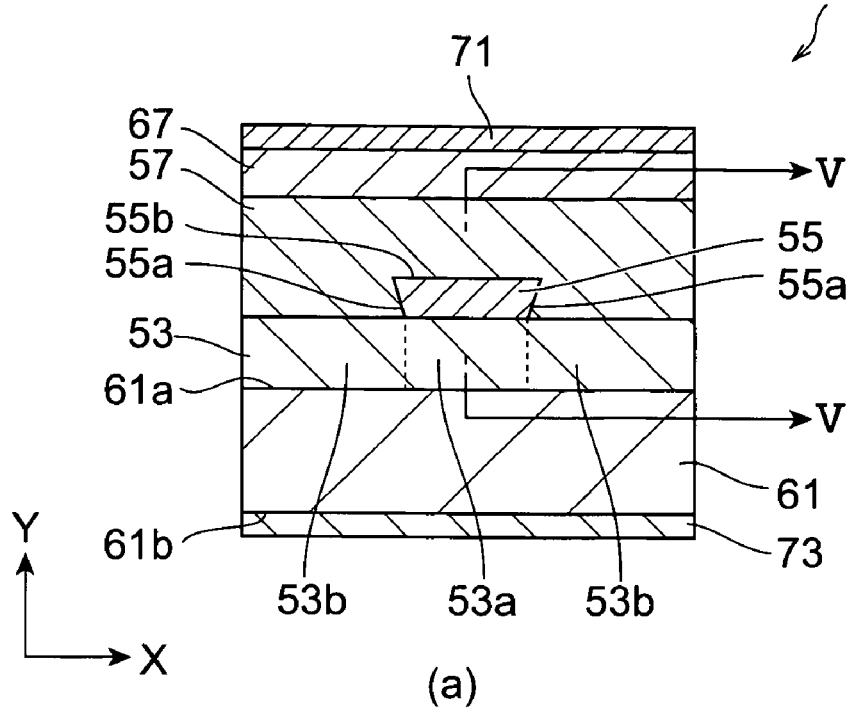
(a)
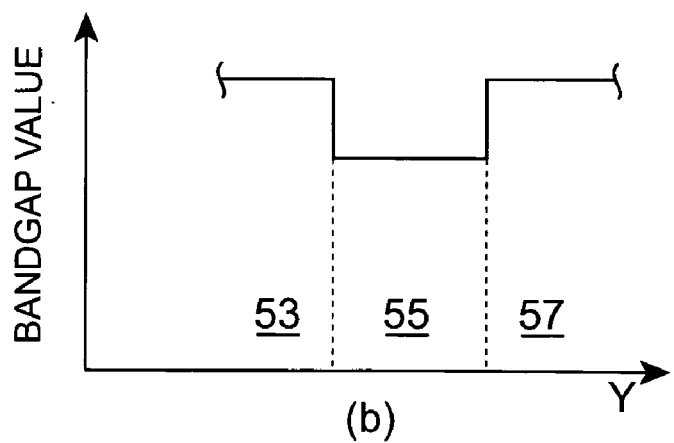
(b)
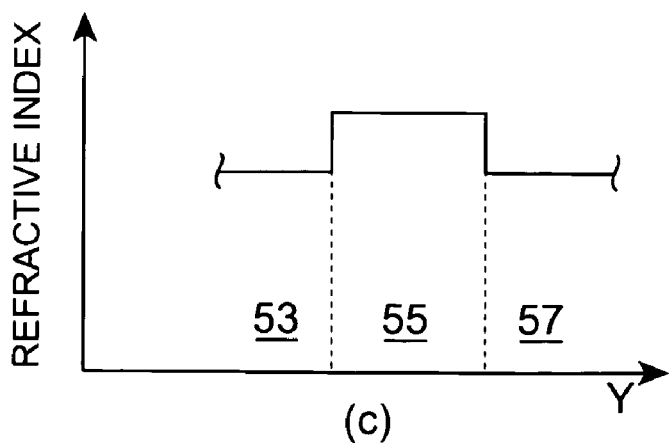
(c)

Fig.10
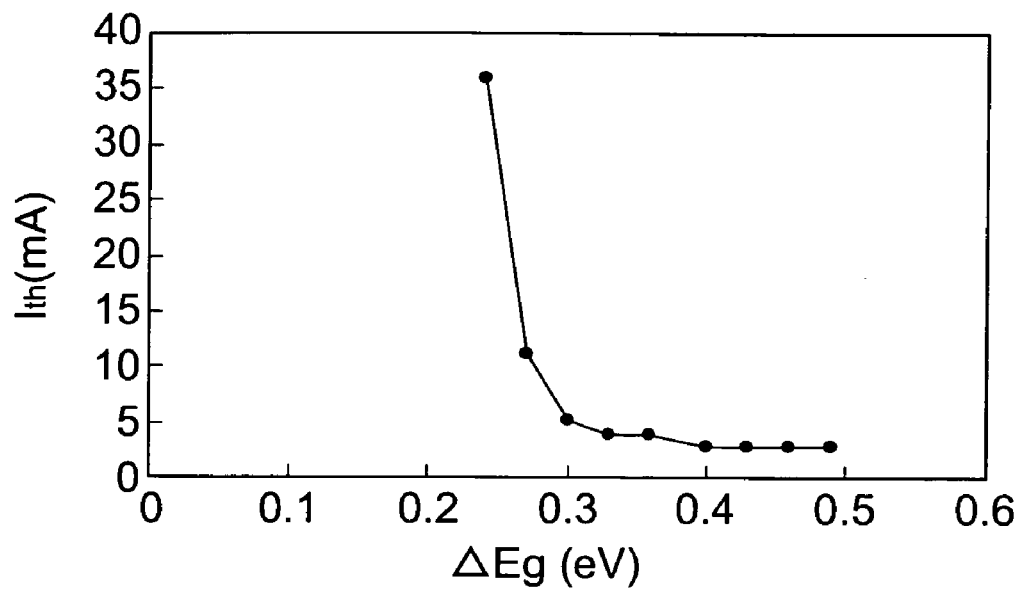
(a)
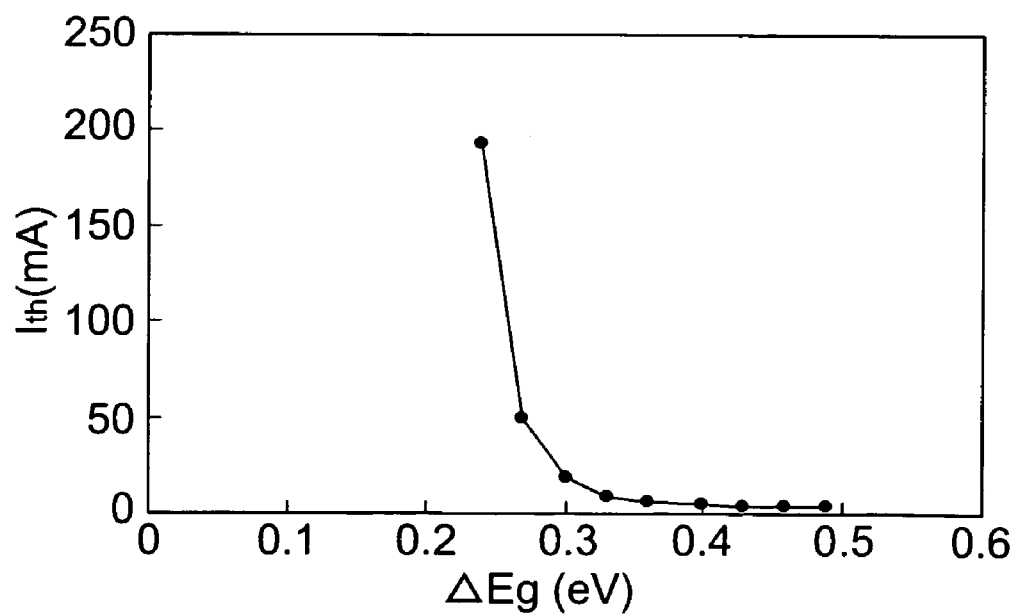
(b)

Fig. 11
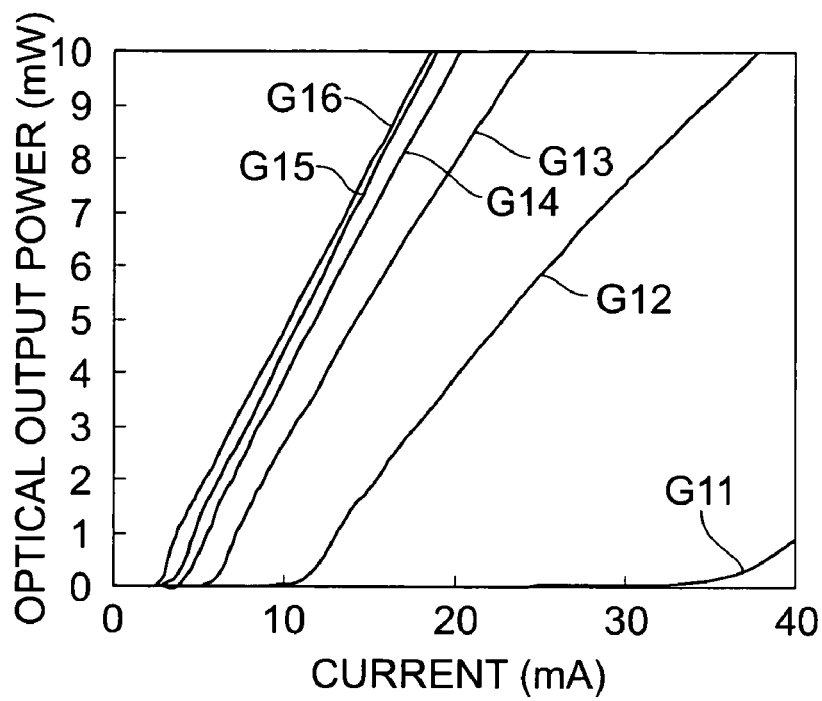
(a)
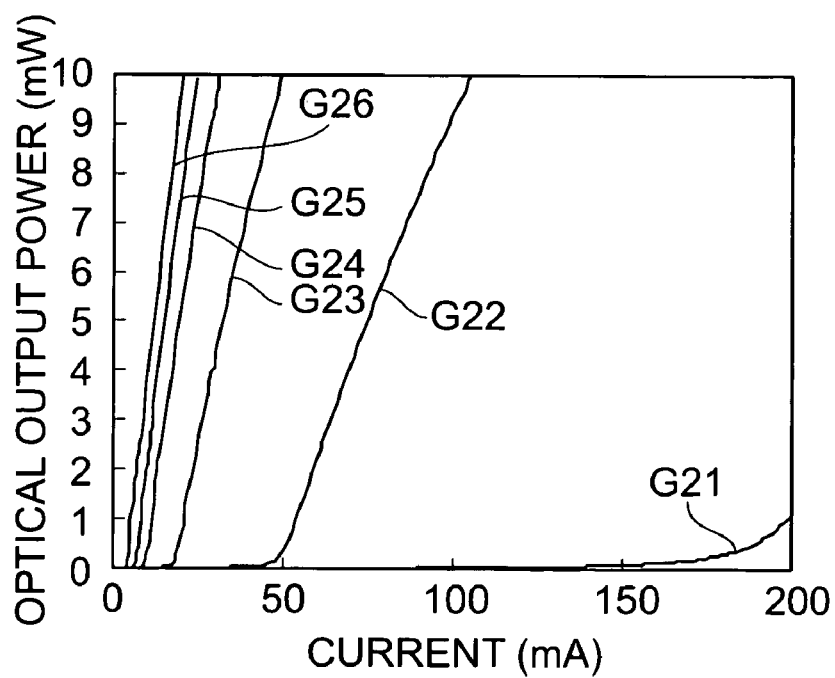
(b)

Fig.13

| 1ST/2ND CONDUCTIVE TYPE SEMICONDUCTOR REGION | ACTIVE LAYER | OPTICAL CONFINEMENT LAYER |
|---|---|---|
| AlGaAs | AlGaAs<br>GaAs<br>GaInAs<br>GaInAsP<br>GaNAs<br>GaNAsP<br>GaNAsSb<br>GaNAsSbP<br>GaInNAs<br>GaInNAsP<br>GaInNAsSb<br>GaInNAsSbP<br>AlGaInP<br>GaInP | AlGaAs<br>GaAs<br>GaInAsP<br>AlGaInP<br>GaInP |
| AlGaInP | AlGaAs<br>GaAs<br>GaInAs<br>GaInAsP<br>GaNAs<br>GaNAsP<br>GaNAsSb<br>GaNAsSbP<br>GaInNAs<br>GaInNAsP<br>GaInNAsSb<br>GaInNAsSbP<br>AlGaInP<br>GaInP | AlGaAs<br>GaAs<br>GaInAsP<br>AlGaInP<br>GaInP |
| GaInP | AlGaAs<br>GaAs<br>GaInAs<br>GaInAsP<br>GaNAs<br>GaNAsP<br>GaNAsSb<br>GaNAsSbP<br>GaInNAs<br>GaInNAsP<br>GaInNAsSb<br>GaInNAsSbP | AlGaAs<br>GaAs<br>GaInAsP |
| GaInAsP | AlGaAs<br>GaAs<br>GaInAs<br>GaInAsP<br>GaNAs<br>GaNAsP<br>GaNAsSb<br>GaNAsSbP<br>GaInNAs<br>GaInNAsP<br>GaInNAsSb<br>GaInNAsSbP | AlGaAs<br>GaAs<br>GaInAsP |

Fig.14
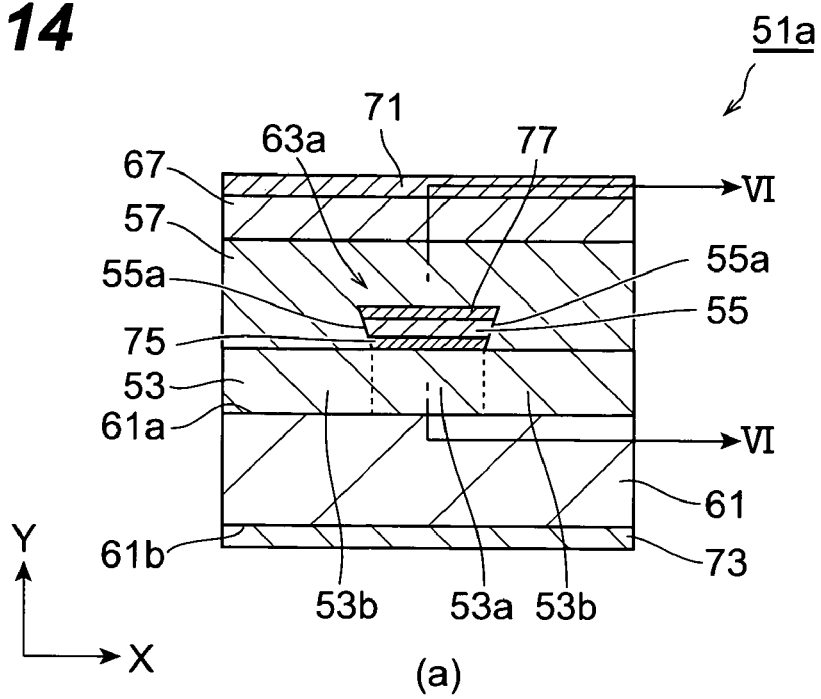
(a)
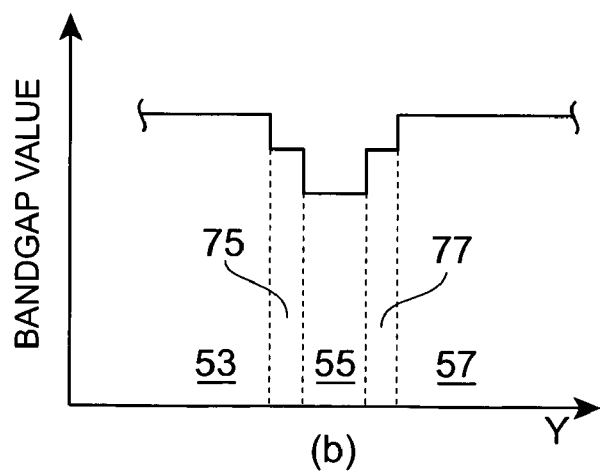
(b)
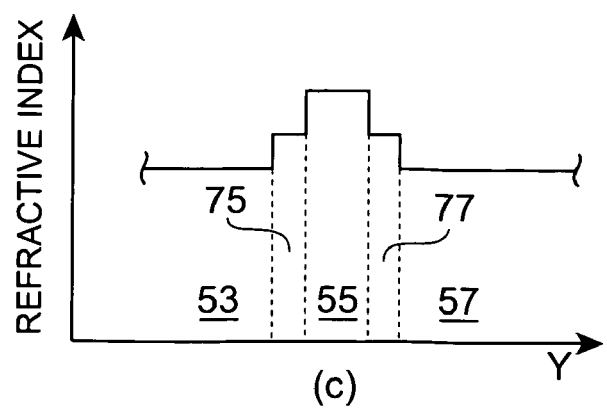
(c)

SEMICONDUCTOR OPTICAL DEVICE

BACKGROUND OF THE INVENTION

1. Field of the Invention

The present invention relates to a semiconductor optical device.

2. Related Background of the Invention

Publication 1 JOURNAL OF QUANTUM ELECTRONICS, VOL.QE-17, NO.2, FEBRUARY 1981, pp. 202–207) discloses a buried hetero-structure semiconductor laser. This semiconductor laser has an active layer made of GaInAsP semiconductor. This active layer is provided between a p-type InP semiconductor layer and an n-type InP semiconductor layer and is located between Inp current block portions of the InP semiconductor layer. Carriers are injected into the active layer and the injected carriers are confined into the active layer by the hetero-barriers at the interfaces between the active layer and the current block portions.

SUMMARY OF THE INVENTION

FIG. 17 shows a method of manufacturing a buried hetero-structure semiconductor laser as described above. As shown in area (a) in FIG. 17, an n-type InP semiconductor layer (n-type cladding layer) 103, an InGaAsP active layer 105, a type InP semiconductor layer (p-type cladding layer) 106, a protecting layer 108 are epitaxially grown on an InP substrate 111. A mask 110 for forming a waveguide structure is formed on the protecting layer 108. Then, as shown in area (b) in FIG. 17, the protecting layer 108, p-type InP semiconductor layer 106, GaInAsP active layer 105 and n-type InP semiconductor layer 103 are etched using the mask 110 to form a mesa 112 for the waveguide structure.

Then, as shown m area (c) in FIG. 17, a current block portion 109 having a p-type semiconductor layer 109a and an n-type semiconductor layer 109b is epitaxially grown on both sides of the mesa 112. Next, as shown in area (d) in FIG. 17, the protecting layer 108 and the mask 110 are removed and a p-type InP semiconductor layer 107 and a p-type GaInAsP semiconductor layer (p-type contact layer) 117 are epitaxially grown thereon. An anode electrode and a cathode electrode are formed on the p-type semiconductor layer 117 and the InP substrate 111, respectively, to form the buried heterostructure semiconductor laser.

In the fabrication of the above buried heterostructure semiconductor laser, epitaxial growth steps are used three times as shown in FIG. 17. It takes long time for each of the epitaxial growth steps and these steps are complicated. Accordingly, What is needed for yield improvement and cost reduction is to reduce the number of the epitaxial growth steps.

It is an object to provide a semiconductor optical device having a structure that permits the reduction of the number of epitaxial growth steps in the fabrication thereof.

According to one aspect of the present invention, a semiconductor optical device comprises a first conductive type semiconductor region, an active layer and a second conductive type semiconductor region. The first conductive type semiconductor region is provided on a surface of GaAs. The first conductive type semiconductor region has a first semiconductor portion and a second semiconductor portion. The first semiconductor portion has a first region and a second region. The second semiconductor portion has a pair of sides. The second semiconductor portion is provided on the first region of the first semiconductor portion. The active layer is provided on the second semiconductor portion of the first conductive type semiconductor region. The active layer has a pair of side surfaces. The second conductive type semiconductor region is provided on the sides and top of the active layer, the sides of the second semiconductor portion, and the second region of the first semiconductor portion of the first conductive type semiconductor region. The bandgap energy of the first conductive type semiconductor region is greater than that of the active layer. The bandgap energy of the second conductive type semiconductor region is greater than that of the active layer. The second region of the first semiconductor portion of the first conductive type semiconductor region and the second conductive type semiconductor region constitute a pn junction.

According to another aspect of the present invention, a semiconductor optical device comprises a first conductive type semiconductor region, an active layer and a second conductive type semiconductor region. The first conductive type semiconductor region is provided on a surface of GaAs. The fist conductive type semiconductor region has a first region and a second region. The active layer is provided on the first region of the first conductive type semiconductor region. The active layer has a pair of sides. The second conductive type semiconductor region is provided on the sides and top of the active layer, and the second region of the first conductive type semiconductor region. The bandgap energy of the first conductive type semiconductor region is greater than that of the active layer. The bandgap energy of the second conductive type semiconductor region is greater than that of the active layer. The second region of the first conductive type semiconductor region and the second conductive type semiconductor region constitute a pn junction.

In the semiconductor optical device according to the above present invention, the first conductive type semiconductor region is made of material permitting the first conductive type semiconductor region to work as an etch stop layer for etching the active layer.

In the semiconductor optical device according to the above aspects, a bandgap energy difference between the first conductive type semiconductor region and the active layer is greater than 0.3 eV, and a bandgap energy difference between the second conductive type semiconductor region and the active layer is greater than 0.3 eV In the semiconductor optical device according to the above aspects, the first conductive type semiconductor region is made of at least one of AlGaAs, AlGaInP, GaInP and GaInAsP, and the second conductive type semiconductor region is made of at least one of AlGaAs, AlGaInP, GaInP and GaInAsP, and the active layer is made of GaInNAs, for example.

The semiconductor optical device according to the above aspects further comprises a second conductive type contact layer provided on the active layer and the second conductive type semiconductor region.

In the semiconductor optical device according to the above aspects, the first conductive type semiconductor region includes a third region and a fourth region, the third region and the second conductive type semiconductor region constitute the pn junction, and dopant concentration of the third region is different from that of the fourth region.

In the semiconductor optical device according to the above aspects, the second conductive type semiconductor region includes a third region and a fourth region, the third region and the first conductive type semiconductor region constitute the pn junction, and dopant concentration of the third region is different from that of the fourth region.

The semiconductor optical device according to the above aspects further comprises a first optical confinement layer provided between the active layer and the first conductive type semiconductor region, and a second optical confinement layer provided between the active layer and the second conductive type semiconductor region.

In the semiconductor optical device according to the above aspects, a GaAs substrate provides the surface of GaAs.

In the semiconductor optical device according to the above aspects, the semiconductor optical device includes a semiconductor laser.

In the semiconductor optical device according to the above aspects, the semiconductor optical device includes a light emitting diode.

In the semiconductor optical device according to the above aspects, the semiconductor optical device includes a semiconductor optical amplifier.

In the semiconductor optical device according to the above aspects, the semiconductor optical device includes an electro-absorption type modulator.

In the semiconductor optical device according to the above aspects, the semiconductor optical device includes a semiconductor optical waveguide.

BRIEF DESCRIPTION OF THE DRAWINGS

The above-described object and other objects, features, and advantages of the present invention will become apparent more easily in the detailed description of the preferred embodiments of the present invention which will be described below with reference to the accompanying drawings.

FIG. 2 is a view for the semiconductor optical device according to the first embodiment.

FIG. 7 is a view showing a modified semiconductor optical device according to the first embodiment.

FIG. 9 is a view for the semiconductor optical device according to the second embodiment.

FIG. 10 shows calculated results of threshold current dependence on bandgap difference ΔEg for a modified semiconductor optical device according to the second embodiment.

FIG. 11 shows calculated results of threshold current dependence on bandgap difference between ΔEg for the modified semiconductor optical device according to the second embodiment.

FIG. 13 is a view showing the list of the combination of the semiconductor material that can be used for the semiconductor optical device of this invention.

FIG. 14 is a view showing another modified semiconductor optical device.

DESCRIPTION OF THE PREFERRED EMBODIMENTS

The teachings of the present invention will readily be understood in view of the following detailed description with reference to the accompanying drawings illustrated by way of example. When possible, parts identical to each other will be referred to with reference symbols identical to each other.

(First Embodiment)

Figure 1:
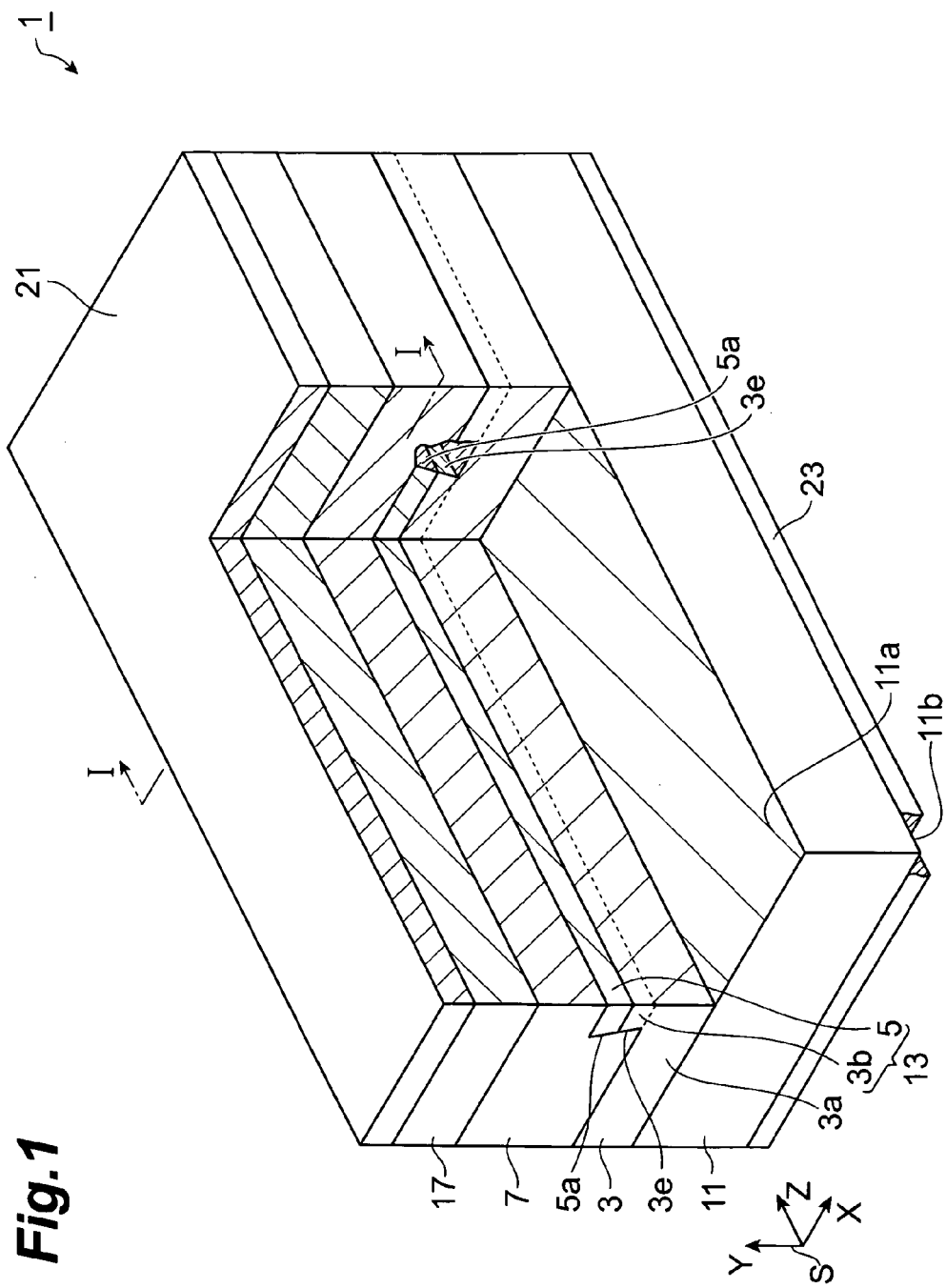
FIG. 1 is a perspective view showing a semiconductor optical device according to the first embodiment.

FIG. 1 is a perspective view showing a semiconductor optical device according to the first embodiment. An XYZ coordinate system S is depicted in FIG. 1. FIG. 2 is a view for the semiconductor optical device according to the first embodiment. Area (a) in FIG. 2 shows a cross sectional view taken along I—I in FIG. 1. Area (b) in FIG. 2 shows a band diagram, taken along II—II in area (a), for the semiconductor optical device according to the first embodiment. Area (c) in FIG. 2 shows a refractive index diagram, taken along II—II in area (a), for the semiconductor optical device according to the first embodiment.

FIGS. 1 and 2 shows a semiconductor optical device 1, such as a semiconductor laser. The semiconductor optical device 1 comprises a first conductive type semiconductor region 3, an active layer 5, and a second conductive type semiconductor region 7. The first conductive type semiconductor region 3 is provided on the surface of a GaAs substrate and has first and second semiconductor portions 3a and 3b. As shown in FIG. 2, the first semiconductor portion 3a includes a first region 3c and a second region 3d located on both sides of the first region 3c. The first region 3c extends in the direction of the z-axis. The second semiconductor portions 3b is located on the first region 3c of the first semiconductor portion 3a. The second semiconductor portion 3b has a pair of sides 3e. The active layer 5 is provided on the second semiconductor portion 3b of the first conductive type semiconductor region 3. The active layer 5 has a pair of sides 5a. The second conductive type semiconductor region 7 is provided on the second region 3d of the first semiconductor portion 3a of the first conductive type semiconductor region 3, the sides 3e of the second semiconductor portion 3b, and the sides 5a and the top 5b of the active layer 5. The second conductive type semiconductor region 7 and the second region 3d of the first semiconductor portion 3a of the first conductive type semiconductor region 3 form a pn junction around the active layer 5. The active layer is made of III-V compound semiconductor.

The first conductive type semiconductor region 3 is made of III-V compound semiconductor, the bandgap of which is greater than that of the active layer 5. In other words, the photoluminescence wavelength of III-V compound semiconductor of the first conductive type semiconductor region 3 is shorter than that of the active layer 5. The second conductive type semiconductor region 7 is made of III-V compound semiconductor, the bandgap of which is greater than that of the active layer 5. In other words, the photoluminescence wavelength of III-V compound semiconductor of the second conductive type semiconductor region 7 is shorter than that of the active layer 5. A photoluminescence wavelength of semiconductor material is equal to a wavelength that corresponds to the bandgap thereof. As seen from the bandgap diagram shown in area (b), the first conductive type semiconductor region 3 and second conductive type semiconductor region 7 confine carriers to the active layer 5. Consequently, the first conductive type semiconductor region 3 works as a cladding layer of the first conductive type and the second conductive type semiconductor region 7 works as a cladding layer of the second conductive type. In the active layer 5, the confined carriers injected from the first conductive type semiconductor region 3 and second conductive type semiconductor region 7 are recombined to generate light.

As shown in the refractive index diagram of area (c) of FIG. 2, the refractive index of the first conductive type semiconductor region 3 is smaller than that of active layer 5. The refractive index of the second conductive type semiconductor region 7 is also smaller than that of active layer 5. Accordingly, the first conductive type semiconductor region 3 and the second conductive type semiconductor region 7 confine light from the active layer 5 in the active layer 5 in both x and y directions. Consequently, the first conductive type semiconductor region 3 and the second conductive type semiconductor region 7 act as optical cladding layers.

The structure of the active layer 5 may be the bulk structure of a single layer, the single quantum well structure of a single quantum well layer or the multiple quantum well structure of a plurality of well layers and barrier layers which are alternately arranged.

The semiconductor optical device 1 further comprises a semiconductor substrate 11. For example, GaAs substrates can be used as the semiconductor substrate 11. On the primary surface 11a of the semiconductor substrate 11, the first conductive type semiconductor region 3 is provided. In the first conductive type semiconductor region 3, the first semiconductor portion 3a is provided on the primary surface 11a of the semiconductor substrate 11, and the second semiconductor portion 3b is provided on the first semiconductor portion 3a. The second semiconductor portion 3b has a ridge shape. The active layer 5 is located between the second conductive type semiconductor region 7 and the second semiconductor portion 3b of the first conductive type semiconductor region 3. The second semiconductor portion 3b and the active layer 5 constitute a semiconductor ridge portion 13 shown in FIG. 1. The semiconductor ridge portion 13 extends in the z-direction. In the semiconductor ridge portion 13, respective carriers from the second conductive type semiconductor region 7 and the second semiconductor portion 3b of the first conductive type semiconductor region 3 are injected into the active layer 5.

The semiconductor optical device 1 further comprises a contact layer 17 of the second conductive type, and electrodes 21 and 23. The contact layer 17 is provided on the second conductive type semiconductor region 7. The electrode 21 is provided on the contact layer 17 and extends in a direction in which the semiconductor ridge portion 13 extends. The electrode 23 is provided on the backside 11b of the semiconductor substrate 11. The bandgap of the contact layer 17 is smaller than that of the second conductive type semiconductor layer 7. Accordingly, the contact layer 17 and the electrode 21 can form an excellent ohmic contact therebetween.

One example of the composition of the semiconductor optical device 1 is as follows:

First conductive type semiconductor region 3:
AlGaAs, AlGaInP, GaInP, GaInAsP of n-type Active layer 5:
Undoped (un-)GaInAs Second conductive type semiconductor region 7:
AlGaAs, AlGaInP, GaInP, GaAsP of p-type Semiconductor substrate 11:
n-type heavily-doped GaAs substrate Contact layer 17:
p-type GaAs.

The first conductive type semiconductor region 3 and the second conductive type semiconductor region 7 can be made of material that is lattice-matched to GaAs. One or more of the semiconductors listed above can be used for the semiconductor portions 3, 5, 7, 11 and 17.

Figure 3:
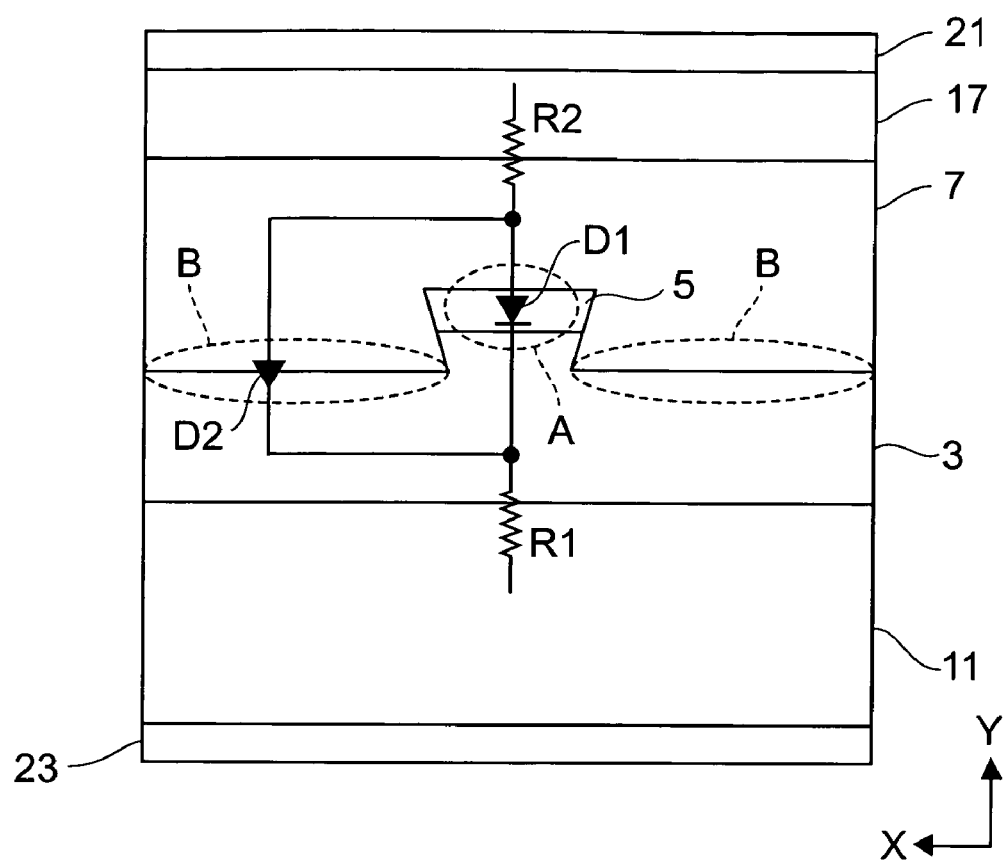
FIG. 3 is an equivalent circuit diagram showing the electrical property of the semiconductor optical device according to the first embodiment.
Figure 4:
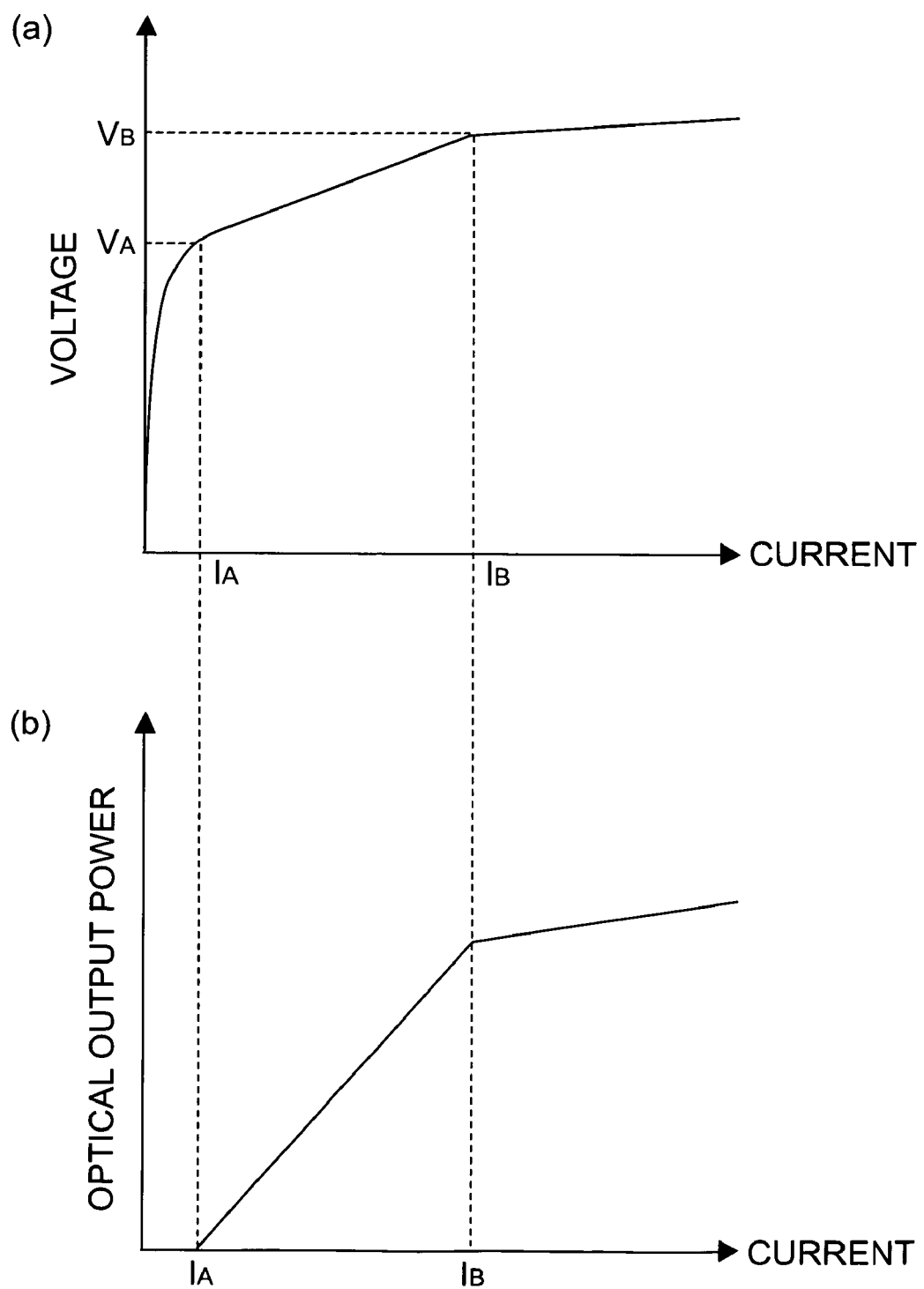
FIG. 4 schematically shows current vs. voltage and current vs. optical output power characteristics for the semiconductor optical device according to the first embodiment.

With reference to FIGS. 3 and 4, the operation of the semiconductor optical device 1 will be described. FIG. 3 is an equivalent circuit diagram showing the electrical property of the semiconductor optical device 1 according to the first embodiment. Area (a) in FIG. 4 shows a graph representing a relationship between the driving voltage and driving current of the semiconductor optical device 1. Area (b) in FIG. 4 shows a graph representing a relationship between the driving current and the optical output (optical power) of the semiconductor optical device 1. Since the bandgap energies of the first and second conductive type semiconductor regions 3 and 7 are greater than the bandgap energy of the active layer 5, the built-in potential of the pn junction (B portion in FIG. 3) constituted by the first conductive type semiconductor region 3 and the second conductive type semiconductor region 7 is greater than that of the pin junction (A portion in FIG. 3) constituted by the first conductive type semiconductor region 3, the active layer 5 and the second conductive type semiconductor region 7. Consequently, the pn junction in the B portion has a higher turn-on voltage and the pin junction in the A portion has a lower turn-on voltage. Therefore, when the driving voltage is between the turn-on voltages of the A portion and the B portion, only the A potion turns on and forward current flows exclusively through the A portion.

As shown in FIG. 3, the equivalent circuit of the semiconductor optical device 1 includes diodes D1 and D2 connected in parallel, which are formed in the A and B portions, respectively. The turn-on voltage $V_A$ (shown area (a) of FIG. 4) of the diode D1 is determined by the built-in potential in the A portion, and mainly depends on bandgap energy of the active layer 5. The turn-on voltage $V_B$ of the diode D2 is determined by the built-in potential in the B portion, and mainly depends on bandgap energies of the first and second conductive type semiconductor region 3 and 7. Since the built-in potential of the B portion is higher than that of the A portion, the turn-on voltage $V_B$ of the diode D2 is greater than the turn-on voltage $V_A$ of the diode D1. The greater the difference between the built-in potentials of the B portion and the A portion is, the greater the difference between the turn-on voltages $V_A$ and $V_B$ is. That is, the greater the bandgap difference between the, active layer 5 and the first and second conductive type semiconductor regions 3 and 7 is, the greater the difference between the turn-on voltages $V_A$ and $V_B$ is. Symbol R1 in FIG. 3 indicates an equivalent resistor in the first conductive type semiconductor region 3, and symbol R2 in FIG. 3 indicates an equivalent resistor in the second conductive type semiconductor region 7.

As shown in area (a) in FIG. 4, when a driving voltage is applied between the electrodes 21 and 23, the diode D1 turns on at the turn-on voltage $V_A$, whereby the resistance of the A portion is lowered and the forward current $I_A$ flows therethrough. Many carriers are supplied to the active layer 5 and these carriers are recombined to generate light. Semiconductor lasers having normal values of cavity loss and internal loss start to oscillate at current slightly greater than current $I_A$ and this current $I_A$ is equivalent to the semiconductor laser threshold current thereof. When the injected current is increased over the threshold current, the optical output power is rapidly increased. The diode D2 in the B portion does not turn on yet and the resistance in the B portion is still high. Therefore, the B portion functions as a current blocking region and thus this current is confined into the A portion (the active layer 5). Besides, since the refractive index of the active layer 5 is greater than the refractive indices of the first and second conductive type semiconductor regions 3 and 7, light generated in the active layer 5 is confined into the active layer 5 and its neighborhood. In this operation in which the diode D1 turns on and the diode D2 does not turn on as described above, the confinement of the current and the light is achieved to provide the following: the effective stimulated emission is caused in the active layer to generates light; the threshold current is low; and the optical power increases in linearly proportion to the amount of the injected current.

When the applied voltage reaches the turn-on voltage $V_B$, the diode D2 turns on. The resistance of the B portion becomes low and the applied current flows into the B portion in addition to the A portion. The B portion of low resistance increases leakage current that does not flow through the active layer 5. Therefore, when the driving current exceeds the current $I_B$ corresponding to the turn-on voltage $V_B$, the leakage current that does not contribute to the stimulated emission becomes large aid thus the slope efficiency becomes low. As a result, the operation region in which the supplied current is greater than the current $I_B$ becomes an output saturation region in which the output power does not increase linearly with current and the relationship between the output power and the injected electrical power is non-linear. If the linear relationship between the current and the output power is needed, then the voltage below the turn-on voltage $V_B$ should be applied thereto.

Figure 5:
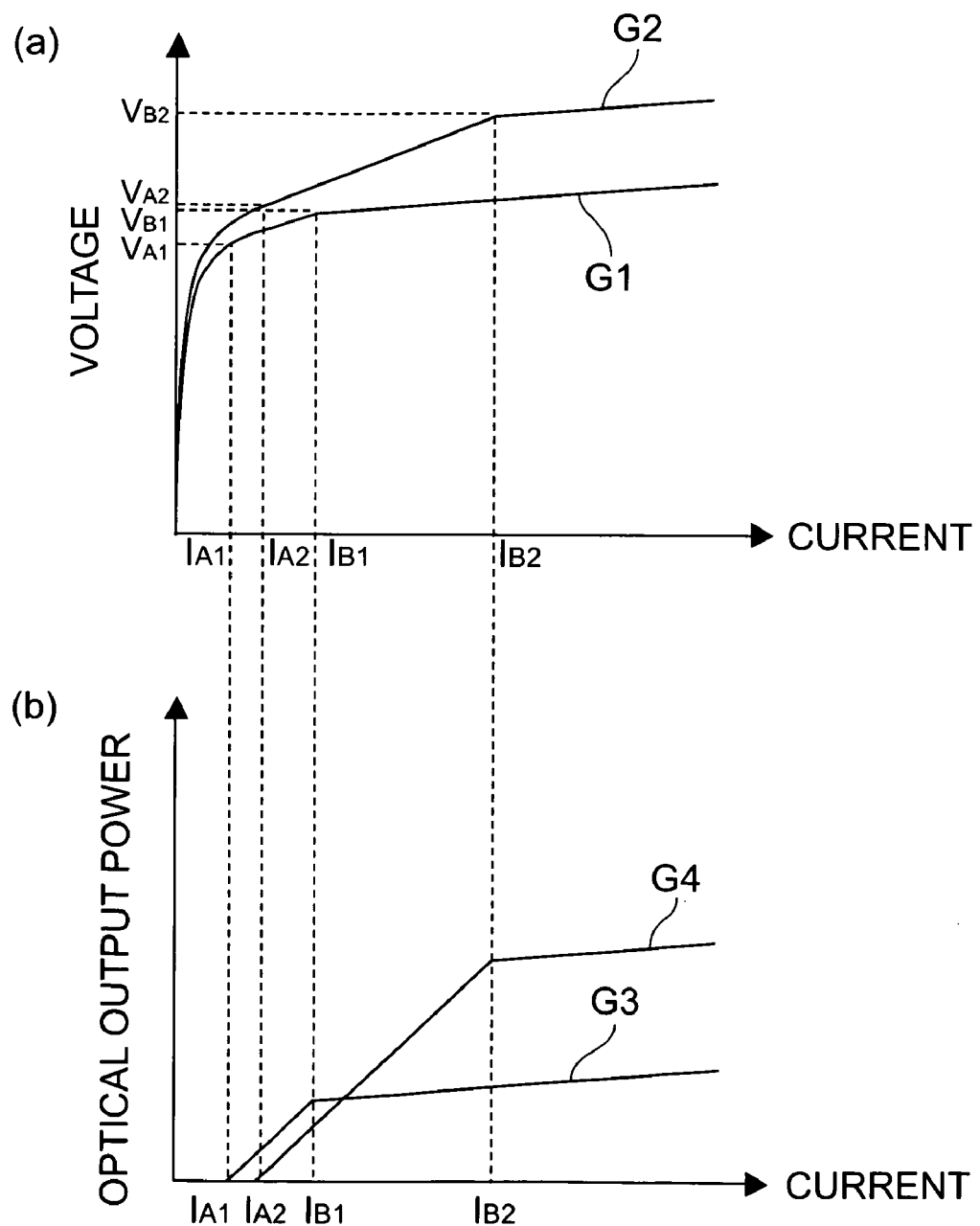
FIG. 5 is a schematic figure explaining dependence of the width of the linear operation region on the bandgap difference between the first and second conductive type semiconductor regions and the active layer for the semiconductor optical device according to the first embodiment.

Areas (a) and (b) in FIG. 5 show graphs for explaining dependence of the width of the linear operation region on the bandgap difference between the first and second conductive type semiconductor regions 3 and 7 and the active layer 5. Curve G1 in area (a) represents current vs. voltage characteristic in which the turn-on voltage in the A portion is $V_{A1}$ and the turn-on voltage in the B portion is $V_{B1}$. Curve G2 in area (a) represents current vs. voltage characteristic in which the turn-on voltage in the A portion is $V_{A2}$ and the turn-on voltage in the B portion is $V_{B2}$. In the graph in area (a), the following condition is satisfied: $V_{B2}-V_{A2}>V_{B1}-V_{A1}$. Curves G3 and G4 in area (b) represent the current vs. optical output power characteristics corresponding to the Curve G1 and G2.

Curves G2 and G4 in areas (a) and (b) in FIG. 5 show that the linear operation region defined by both current $I_{A2}$ corresponding to the turn-on voltage $V_{A2}$ and current $I_{B2}$ corresponding to the turn-on voltage $V_{B2}$ becomes wide if the bandgap difference (the turn-on voltage difference) between the active layer 5 and the first and second conductive type semiconductor regions 3 and 7 is large. On the other hand, curves G1 and G3 show that the linear operation region defined by both current $I_{A1}$ corresponding to the turn-on voltage $V_{A1}$ and current $I_{B1}$ corresponding to the turn-on voltage $V_{B1}$ becomes narrow if the bandgap difference (the turn-on voltage difference) between the active layer 5 and the first and second conductive type semiconductor regions 3 and 7 is small and the turn-on voltage difference is small. As the difference between the turn-on voltage $V_A$ and the tun-on voltage $V_B$ becomes larger, the linear operation region becomes wider. Accordingly, it is preferable that the bandgap difference between the active layer 5 and the first and second conductive type semiconductor regions 3 and 7 be large.

Figure 6:
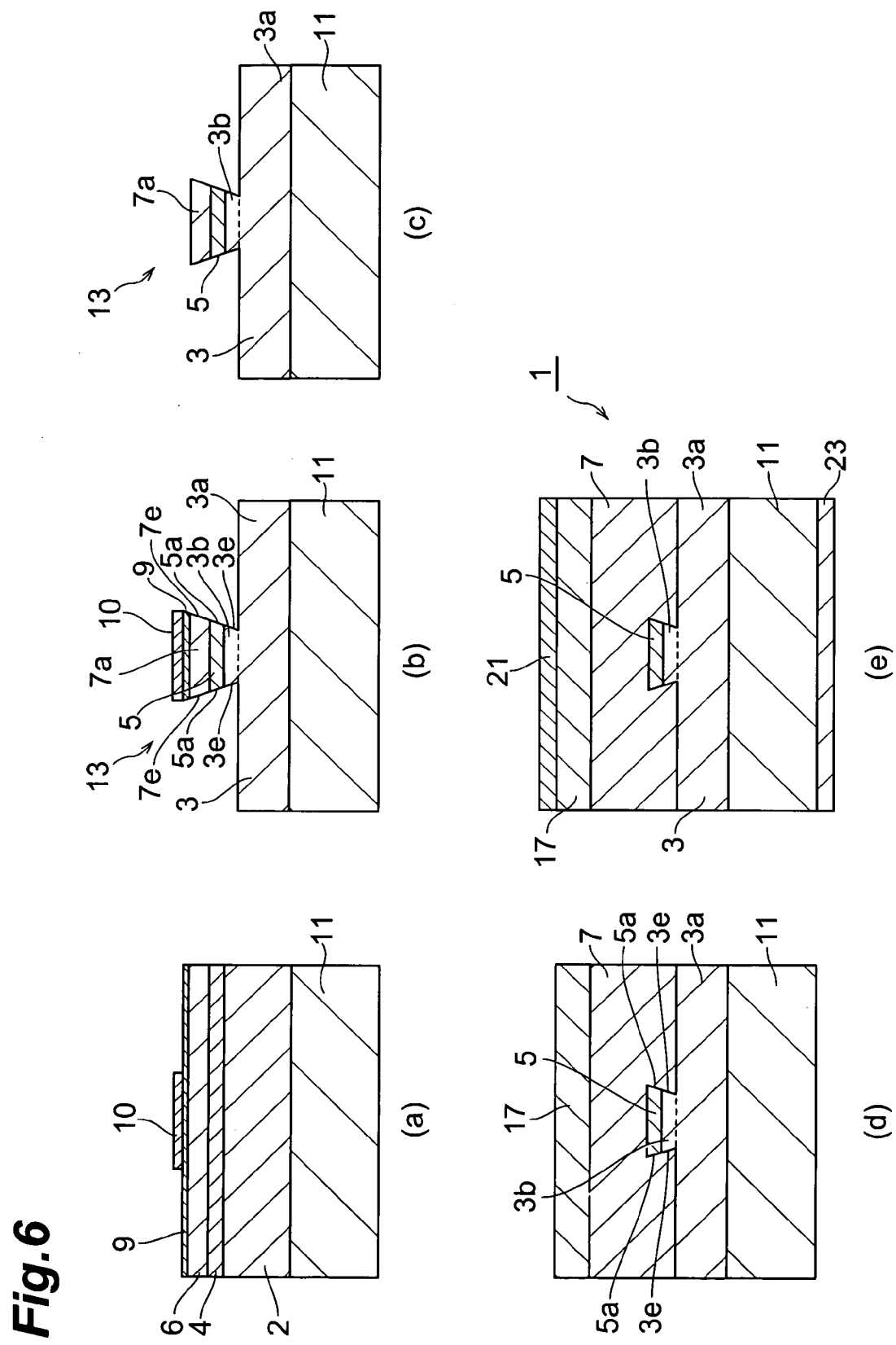
FIG. 6 is a view for explaining the fabrication of the semiconductor optical device.

With reference to FIG. 6, the fabrication of the semiconductor optical device will be explained. As shown in area (a) in FIG. 6, a first conductive type semiconductor layer 2, an active layer 4, a second conductive type semiconductor layer 6 and a protect layer 9 are grown on the semiconductor substrate 11 made of GaAs (the first crystal growth step). The above layers can be grown using Organo-Metallic Vapor Phase Epitaxy (OMVPE) method or Molecular Beam Epitaxy (MBE) method, for example. Then, an etching mask 10 is formed on the protect layer 9 for forming a stripe-shaped semiconductor ridge portion 13. For example, the material of the etching mask 10 can be made of insulator, such as SiN or $SiO_2$.

As shown in area (b) of FIG. 6, the protect layer 9, the second conductive semiconductor layer 6, the active layer 4, the first conductive type semiconductor layer 2 are partially etched using the etching mask 10 by wet etching or dry etching to form the second conductive semiconductor layer 7a, the active layer 5 and the second semiconductor portion 3b of the first conductive type semiconductor region 3. After the etching, the sides 7e of the second conductive semiconductor layer 7a, the sides 5a of the active layer 5 and the sides 3e of the second semiconductor portion 3b of the first conductive type semiconductor region 3 are formed. The semiconductor ridge portion 13 includes the active layer 5 and the semiconductor portion 3b. Area (b) in FIG. 6 shows the semiconductor ridge portion 13 that has an inverted-mesa shape. If the crystal axis along which the mesa-stripe is formed and etchant therefor can be selected properly, then the etching is carried out to form another shape of the semiconductor ridge portion 13.

As shown in area (c) of FIG. 6, the etching mask 10 and protect layer 9 are removed. As shown in area (d) of FIG. 6, the remaining portion of the second conductive type semiconductor region 7 and the contact layer 17 are grown thereon (the second crystal growth). The electrodes 21 and 23 are, finally, formed on the contact layer 17 and the backside of the semiconductor substrate 11, respectively, to complete the semiconductor optical device 1.

Figure 17:
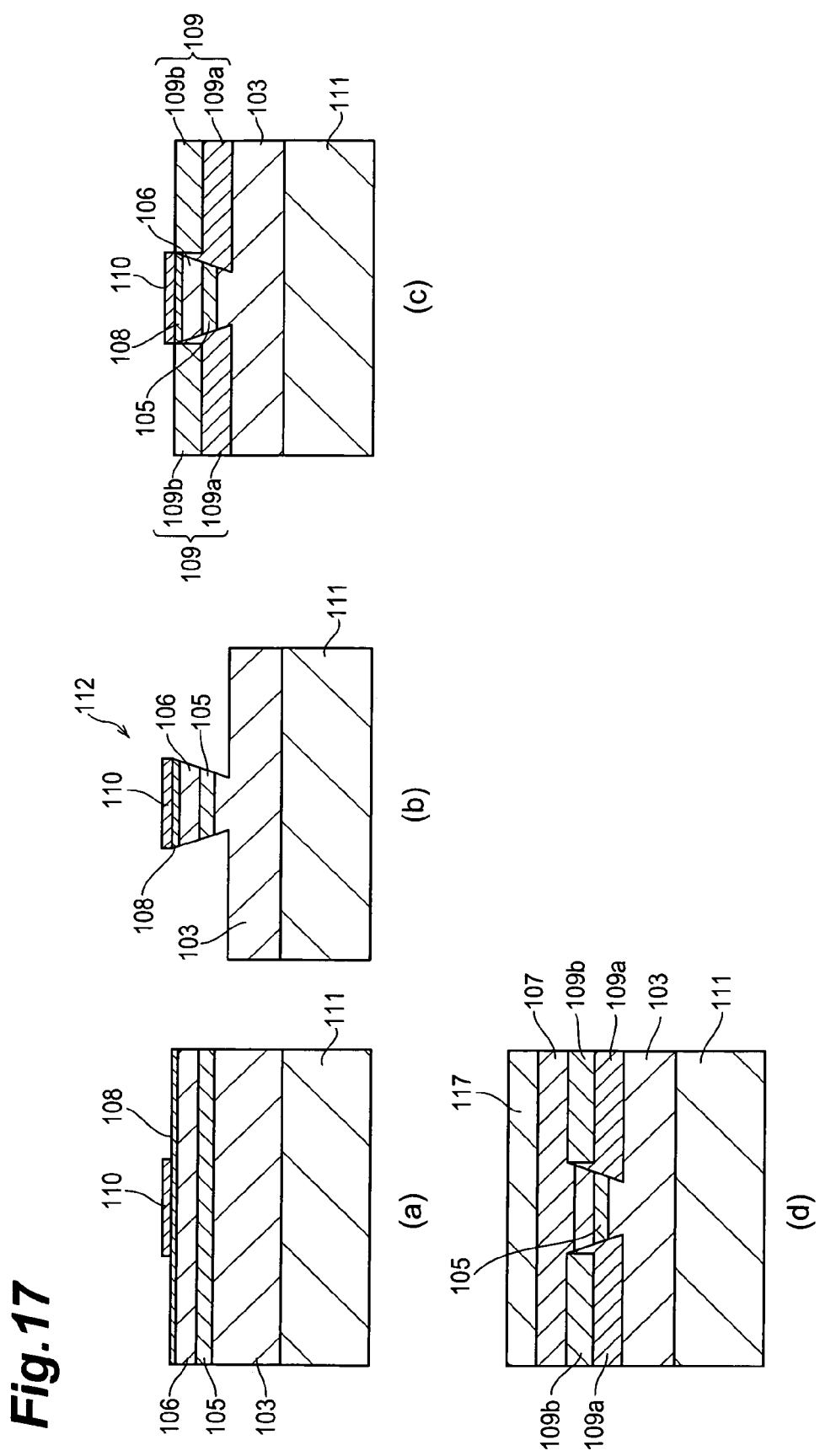
FIG. 17 is a view showing an example of the steps for fabricating a buried heterostructure semiconductor laser.

The semiconductor optical device 1 does not need the current block portion as used in buried heterostructure semiconductor lasers in FIG. 17. As seen from the foregoing explanations, the step of growing the current block portion is not needed in the fabrication of the semiconductor optical device according to the present embodiment, as compared to the fabrication of the buried heterostructure semiconductor lasers shown in FIG. 17. Therefore, the semiconductor optical device permits the yield improvement and cost reduction because the number of the epitaxial growth steps is reduced (twice in the present embodiment).

In a modified structure of the semiconductor optical device 1, the size of the contact layer 17 can be restricted and the restricted contact layer is located only on the part of the second conductive type semiconductor 7 provided above the active layer 5. In the modified structure, the distance between the restricted contact layer 17 and the pn junction (the B portion in FIG. 3) of the first and second conductive type semiconductor regions 3 and 7 is longer than the distance between the restricted contact layer 17 and the active layer 5. Accordingly, the resistance from the restricted contact layer 17 to the pn junction (the B portion in FIG. 3) is enhanced to increase the turn-on voltage $V_B$ of the pn junction (the B portion in FIG. 3). Consequently, the difference between the turn-on voltages $V_B$ and $V_A$ is increased and the carriers are confined to the active layer 5 even in a higher power region, thereby widening the linear operation region.

In buried heterostructure semiconductor optical devices as shown in, for example, Publication 1, the injected carriers are blocked using the current blocking region having a pn junction constituted by a p-type semiconductor layer and an n-type semiconductor layer which are inversely biased. However, in this type of lasers, a plurality of pn junctions should be formed to realize a current blocking, which leads to a large parasitic capacitance, and prevents the high-speed operation of the buried heterostructure semiconductor optical devices. On the other hand, since the semiconductor optical device according to the present embodiment blocks the injected carriers by use of the single pn junction, biased forwardly, constituted by the first and second conductive type semiconductor regions 3 and 7, only one pn junction is needed for current blocking and thus the capacitance is decreased compared with the conventional buried heterostructure semiconductor optical devices. Therefore, the semiconductor optical device 1 can operate at higher speed.

As described above, the surface of GaAs semiconductor can be provided by GaAs substrates. Since available GaAs substrates are large-sized such as 6 inch in a diameter and are high quality and inexpensive, the productivity improvement and cost reduction of the semiconductor optical device 1 are achieved and large-scaled integration including the semiconductor optical device 1 can be realized easily.

FIG. 7 is a view showing a modified semiconductor optical device 1a according to the present embodiment. Area (a) in FIG. 7 shows a cross sectional view. Area (b) in FIG. 7 shows a band diagram, taken along III—III in area (a), for the modified semiconductor optical device 1a. Area (c) in FIG. 7 shows a refractive index diagram, taken along III—III in area (a), for the modified semiconductor optical device 1a. The semiconductor optical device 1a further comprises a first optical confinement layer 25 and a second optical confinement layer 27. The first optical confinement layer 25 is provided between the first conductive type semiconductor region 3 and the active layer 5. The second optical confinement layer 27 is provided between the second conductive type semiconductor region 7 and the active layer 5. The second semiconductor portion 3b of the first conductive type semiconductor region 3, the active layer 5, the first optical confinement layer 25 and the second optical confinement layer 27 constitute a semiconductor ridge portion 13a.

The first optical confinement layer 25 is made of material having a bandgap energy between that of the first conductive type semiconductor region 3 and that of the active layer 5. The second optical confinement layer 27 is made of material having a bandgap energy between that of the second conductive type semiconductor region 7 and that of the active layer 5. Carriers are injected into the active layer 5 from the first and second conductive type semiconductor regions 3 and 7 through the first and second optical confinement layers 25 and 27. As shown in area (b) of FIG. 7, the injected carriers in the modified semiconductor optical device 1a are confined into the active layer 5 by the first and second optical confinement layers 25 and 27.

The first optical confinement layer 25 has a refractive index between that of the active layer 5 and that of the first conductive type semiconductor region 3. The second optical confinement layer 27 has a refractive index between that of the active layer 5 and that of the second conductive type semiconductor region 7. As shown in area (c) of FIG. 7, the first conductive type semiconductor region 3 and the second conductive type semiconductor region 7 confine light from the active layer 5 into the first and second optical confinement layers 25 and 27 and the active layer 5.

The first and second optical confinement layers 25 and 27 permit the current confinement and the optical confinement separately. These optical confinement layers enhance the confinement of the light into the active layer 5, leading to improvements of lasing characteristics such as a threshold current, reduction and a less dependence on temperature. If the active layer 5 has a quantum well structure constituted by thin films, the optical confinement factor is small. But, by introducing the first and second optical confinement layers 25 and 27, the optical confinement factor of the quantum well structure increases significantly, thereby drastically improving the oscillation characteristics.

(Second Embodiment)

Figure 8:
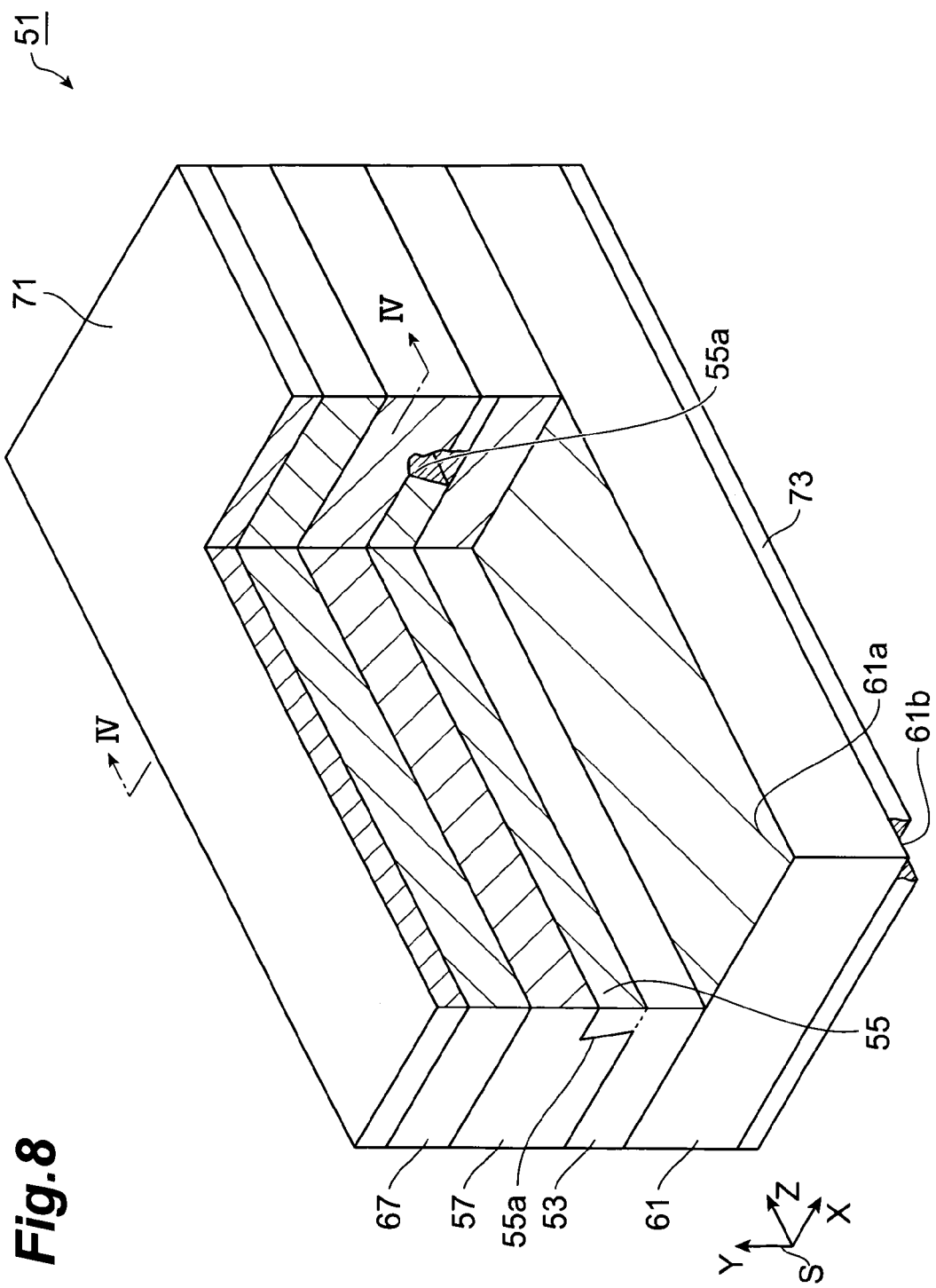
FIG. 8 is a perspective view showing a semiconductor optical device according to the second embodiment.

FIG. 8 is a perspective view showing a semiconductor optical device according to the second embodiment. An XYZ coordinate system S is depicted in FIG. 8. FIG. 9 is a view for the semiconductor optical device according to the second embodiment. Area (a) in FIG. 9 shows a cross sectional view taken along IV—IV in FIG. 8. Area (b) in FIG. 9 shows a band diagram, taken along V—V in area (a), for the semiconductor optical device according to the second embodiment. Area (c) in FIG. 9 shows a refractive index diagram, taken along V—V in area (a), for the semiconductor optical device according to the second embodiment. FIGS. 8 and 9 shows a semiconductor optical device 51, such as a semiconductor laser.

The semiconductor optical device 51 comprises a first conductive type semiconductor region 53, an active layer 55, and a second conductive type semiconductor region 57. The first conductive type semiconductor region 53 is provided on the surface of a GaAs substrate and has first and second regions 53a and 53b as shown in FIG. 2. The second region 53b is adjacent to the first region 53a. The first region 53a extends in the z-direction. The active layer 55 is provided on the first region 53a of the first conductive type semiconductor region 53. The active layer 55 has a pair of sides 55a. The second conductive type semiconductor region 57 is provided on the second region 53b of the first conductive type semiconductor region 53, and the sides 55a and top 55b of the active layer 55. The second conductive type semiconductor region 57 and the second region 53b of the first conductive type semiconductor region 53 form a pn junction. The active layer 55 is made of III-V compound semiconductor.

The first conductive type semiconductor region 53 is made of III-V compound semiconductor, the bandgap of which is greater than that of the active layer 55. The second conductive type semiconductor region 57 is made of III-V compound semiconductor, the bandgap of which is greater than that of the active layer 55. As seen from the bandgap diagram shown in area (b) of FIG. 9, the first conductive type semiconductor region 53 and second conductive type semiconductor region 57 confine carriers to the active layer 55. Consequently, the first conductive type semiconductor region 53 works as a cladding layer of the first conductive type and the second conductive type semiconductor region 57 works as a cladding layer of the second conductive type. In the active layer 55, the confined carriers injected from the first conductive type semiconductor region 53 and the second conductive type semiconductor region 57 are recombined to generate light.

As shown in area (c) of FIG. 9, the refractive index of the first conductive type semiconductor region 53 is smaller than that of active layer 55. The refractive index of the second conductive type semiconductor region 57 is also smaller than that of active layer 55. Accordingly, the first conductive type semiconductor region 53 and the second conductive type semiconductor region 57 confine light from the active layer 55 in the active layer 55 in both x and y directions. Consequently, the first conductive type semiconductor region 53 and the second conductive type semiconductor region 57 act as optical cladding layers.

The structure of the active layer 55 may be the bulk structure of a single layer, the single quantum well structure of a single quantum well layer and the multiple quantum well structure of a plurality of well layers and barrier layers which are alternately arranged.

The semiconductor optical device 51 further comprises a semiconductor substrate 61. For example, GaAs substrates can be used as the semiconductor substrate 61. On the primary surface 61a of the semiconductor substrate 61, the first conductive type semiconductor region 53 is provided.

The semiconductor optical device 51 further comprises a contact layer 67 of the second conductive type, and electrodes 71 and 73. The contact layer 67 is provided on the second conductive type semiconductor region 57. The electrode 71 is provided on the contact layer 67. The electrode 71 extends in a direction in which the active layer 55 extends. The electrode 73 is provided on the backside 61b of the semiconductor substrate 61. The bandgap of the contact layer 67 is smaller than that of the semiconductor conductive type semiconductor layer 57. Accordingly, the contact layer 67 and the electrode 71 can form an excellent ohmic contact therebetween.

In the semiconductor optical device 51, since the first conductive type semiconductor region 53 and the second conductive type semiconductor region 57 each has a bandgap energy greater than that of the bandgap of the active layer 55, the built-in potential of the pn junction constituted by the first conductive type semiconductor region 53 and the second conductive type semiconductor region 57 is greater than that of the pin junction constituted by the first conductive type semiconductor region 53, the active layer 55 and the second conductive type semiconductor region 57. Therefore, the semiconductor optical device 51 has an equivalent circuit as in FIG. 3 and operates in the same manner as the semiconductor optical device 1. Namely, carriers in the first conductive type semiconductor region 53 and the second conductive type semiconductor region 57 are blocked by the pn junction constituted by the first conductive type semiconductor region 53 and the second conductive type semiconductor region 57, and are exclusively injected and confined into the active layer 55. Thus, the semiconductor optical device 51 is effective in confining the carriers into the active layer 55.

The method of fabricating the semiconductor optical device 51 is different from the method of fabricating the semiconductor optical device 1 (FIG. 6) in the following: the method of fabricating the semiconductor optical device 51 does not include the etching of the first conductive type semiconductor region 53 in the etching process shown in area (b) of FIG. 6. This method does not include the growth of current block portion (as shown in area (c) in FIG. 17) and thus the number of epitaxial growth steps is decreased like the case of the semiconductor optical device 1.

In a modified structure of the semiconductor optical device 51, the size of the contact layer 67 can be restricted and the restricted contact layer is located only on the part of the second conductive type semiconductor 57 provided above the active layer 55. In the modified structure, the distance between the restricted contact layer 67 and the pn junction (the B portion in FIG. 3) of the first and second conductive type semiconductor regions 53 and 57 is longer than the distance between the restricted contact layer 67 and the active layer 55. Accordingly, the resistance from the restricted contact layer 67 to the pn junction (the B portion in FIG. 3) is enhanced to increase the turn-on voltage $V_B$ of the pn junction (the B portion in FIG. 3). Consequently, the difference between the turn-on voltages $V_B$ and $V_A$ is increased and the carriers are confined to the active layer 55 even in a higher power region to widen the linear operation region.

Since the semiconductor optical device 51 according to the present embodiment blocks the injected carriers by use of the single pn junction which is biased forwardly and is constituted by the first and second conductive type semiconductor regions 53 and 57, only one pn junction is needed for current blocking and thus the capacitance is decreased compared with the conventional buried heterostructure semiconductor optical devices. Therefore, the semiconductor optical device 51 can operate at high speed.

As described above, the surface of GaAs semiconductor can be provided by GaAs substrates. Since available GaAs substrates are large-sized such as 6 inch in a diameter and are high quality and inexpensive, the productivity improvement and cost reduction of the semiconductor optical device 51 are achieved and large-scaled integration of the semiconductor optical device 51 can be easily realized.

The inventors have found that the present structure can improve the temperature characteristics of the semiconductor optical device 51. FIG. 10 shows calculated results of threshold current dependence on bandgap difference ΔEg for a modified semiconductor optical device according to the present embodiment. Areas (a) and (b) in FIG. 10 show graphs representing a relationship between the oscillating threshold current $I_{th}$ and the bandgap difference ΔEg between the first and second conductive type semiconductor regions 53, 57 and the active layer 55. The graph in area (a) of FIG. 10 shows data calculated at the device temperature of 25 Celsius degree, and the graph in area (b) of FIG. 10 shows data calculated at the device temperature of 85 Celsius degree. The material of the first and second conductive type semiconductor layers 53 and 57 can be $Ga_{0.51}In_{0.49}P$ and the active layer 55 can be made of an $Al_xGa_{1-x}As$ single film. The bandgap Eg of $Al_xGa_{1-x}As$ of the active layer 55 is changed as shown in Table 1 and the bandgap difference ΔEg is adjusted by changing the bandgap Eg.

TABLE 1

| x | Eg | Δ Eg |
|---|---|---|
| 0 | 1.42 | 0.49 |
| 0.025 | 1.46 | 0.46 |
| 0.05 | 1.49 | 0.43 |
| 0.075 | 1.52 | 0.40 |
| 0.1 | 1.55 | 0.36 |
| 0.125 | 1.58 | 0.33 |
| 0.15 | 1.61 | 0.30 |
| 0.175 | 1.64 | 0.27 |
| 0.2 | 1.67 | 0.24 |

As shown in areas (a) and (b) of FIG. 10, if the bandgap difference ΔEg is more than 0.3 eV, the threshold current $I_{th}$ remains low regardless of the operating temperature. The threshold current $I_{th}$ is kept to be as small as 18 mA even in high temperature of 85 Celsius degree if the bandgap difference ΔEg is equal to or more than 0.3 eV.

FIG. 11 shows graphs representing the calculated results of the current vs. optical output characteristics at the bandgap values listed in the Table 1. Area (a) in FIG. 11 shows a graph representing the calculated results of the current vs. optical output characteristics at the temperature of 25 Celsius degree. Area (b) in FIG. 11 shows a graph representing the calculated results of the current vs. optical output characteristics at the temperature of 85 Celsius degree. In areas (a) and (b) of FIG. 11, curves G11 and G21 correspond to the bandgap difference ΔEg of 0.24 eV Curves G12 and G22 correspond to the bandgap difference ΔEg of 0.27 eV Curves G13 and G23 correspond to the bandgap difference ΔEg of 0.30 eV Curves G14 and G24 correspond to the bandgap difference ΔEg of 0.33 eV curves G15 and G25 correspond to the bandgap difference ΔEg of 0.36 eV Curves G16 and G26 correspond to the bandgap difference ΔEg of 0.49 eV As seen from FIG. 11, the greater the bandgap is, the larger the emission efficiency is. This is because the large bad gap difference ΔEg permits the pn junction between the first conductive type semiconductor region 53 and the second conductive type semiconductor region 57 to effectively block carriers, thereby confining the carriers into the active layer 55.

Figure 12:
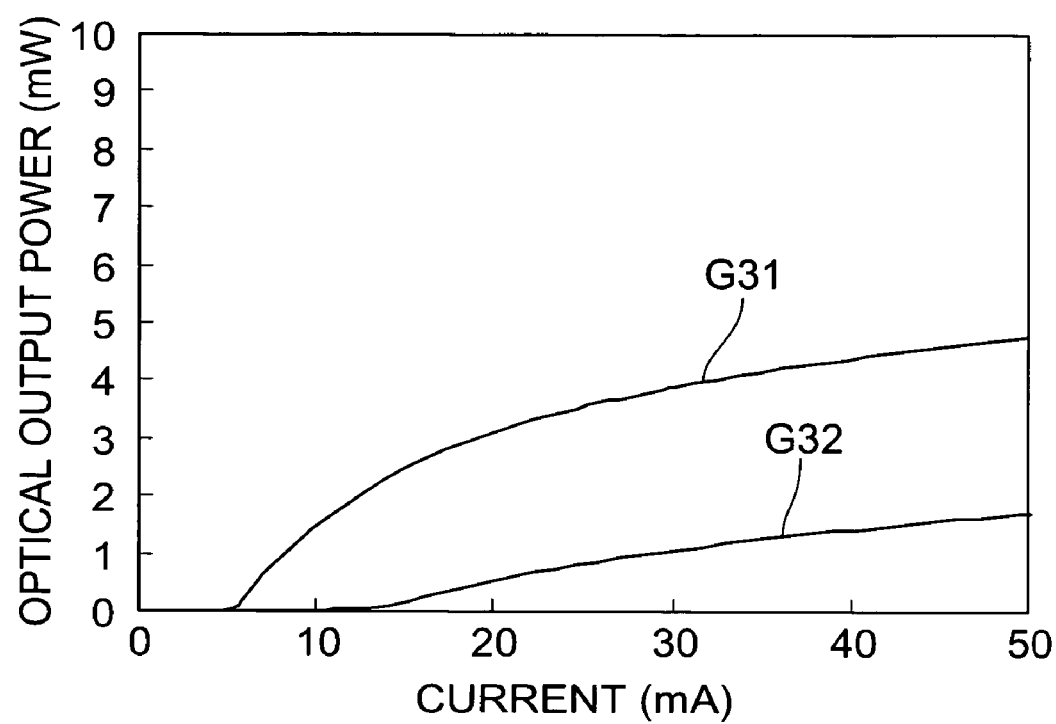
FIG. 12 shows a calculated result of the current vs. optical output characteristics of the semiconductor optical device made using semiconductor material lattice-matched to InP of the substrate.

The inventors have also studied optical semiconductor devices formed on InP substrates. In a specific optical semiconductor device, InP is used as material of the first and second semiconductor regions and $Ga_{0.39}In_{0.61}As_{0.845}P_{0.155}$ is used as material of the active layer. The bandgap energy difference ΔEg between the active layer and the first and second semiconductor regions is 0.55 eV FIG. 12 is a calculated result showing the current vs. optical output characteristics of the semiconductor optical device made using semiconductor material lattice-matched to InP of the substrate. Curve G31 indicates data measured at 25 Celsius degree and curve G32 indicates data measured at 85 Celsius degree. As shown in FIG. 12, in a semiconductor optical device using semiconductor material lattice-matched to InP of the substrate, the optical power from the semiconductor optical device is saturated in a range of a few milli-watts even at a relatively low device temperature. Therefore, this device cannot be applied to a practical use. This saturation may be caused by leakage current flowing outside the active layer in the semiconductor optical device containing semiconductors grown on the InP substrate. On the other hand, if the bandgap energy difference ΔEg is greater than 0.55 eV in the semiconductor optical device 51 according to the present embodiment, carriers are effectively confined into the active layer.

Since the active layer 55 and the first and second conductive type semiconductor regions 53, 57 are provided on the surface of GaAs substrate, the semiconductor optical device 51 has the above advantage. FIG. 13 lists the combinations of material that can provide the advantage. The bandgap energy difference ΔEg by use of materials listed in FIG. 13 can be more than 0.3 eV (or 0.55 eV) by adjusting compositions of the materials. The material listed in FIG. 13 can be used for the semiconductor optical device 1 and other semiconductor optical devices according to the embodiments without limiting to the semiconductor optical device 51. These semiconductor optical devices have superior temperature characteristics as good as the semiconductor optical device 51.

Specific combinations selected from FIG. 13 are further explained below. In the semiconductor optical device including the active layer 55 made of III-V compound semiconductor containing at least nitrogen, the following materials having high bandgap energy can be used for the first and second conductive semiconductor regions 53 and 57: AlGaInP, GaInP, AlGaAs and GaInAsP. Especially, the bandgap energies of AlGaInP, AlGaAs and GaInAsP are greater than that of InP and these materials provide the following bandgap energy ranges: 1.9 eV to 2.3 eV, 1.42 eV to 2.16 eV and 1.42 eV to 1.9 eV, respectively. GaInP has the high bandgap energy of 1.9 eV If one of the above materials is used for the first semiconductor region 53 and the second semiconductor region 57, the bandgap difference ΔEg can be made larger, leading to a strong carrier confinement into active layer 55. Consequently, the semiconductor optical device 51 exhibits excellent temperature characteristics. In addition, the above materials permit the turn-on voltage difference between the A and B portions shown in FIG. 3 to increase, so that the liner operation region becomes large.

The active layer 55 made of the III-V compound semiconductor containing at least nitrogen in the semiconductor optical device can generate light of a wavelength larger than 1 micrometer, such as 1.3 or 1.55 micrometer band for optical communications. An example of material preferable for the active layer 55 is III-V compound semiconductors containing at least nitrogen, gallium and arsenic. These III-V compound semiconductors have lattice constants equal to or close to the lattice constant of GaAs and therefore can be grown on GaAs substrates with excellent crystalline quality. Typical examples of the III-V compound semiconductors containing at least nitrogen, gallium and arsenic are GaNAs and GaInNAs. The III-V compound semiconductors containing at least nitrogen, gallium and arsenic can be lattice-matched to GaAs by adjusting their compositions property. These III-V compound semiconductors are used for generating light of a long wavelength from 1 to 1.6 micrometers.

The active layer 55 can be made of material containing phosphorus and/or antimony in addition to the constituents of GaNAs or GaInNAs. Antimony can work as surfactant and can suppress three-dimensional growth in GaNAs and GaInNAs crystal, thereby improving the crystal quality Phosphorus can improve the crystal quality and reliability by reducing the local crystal strain in GaNAs and GaInNAs. Phosphorus contributes to accelerating the introduction of nitrogen into the active layer 55 during crystal growth. Examples of material for the active layer 55 are listed below: GaNAsP, GaInNAsP, GaNAsSb, GaInNAsSb, GaNAsSbP, GaInNAsSbP and so on.

The active layer 55 can be made of III-V compound semiconductor not containing nitrogen, such as AlGaInP, GaInP, AlGaAs, GaAs, GaInAsP or GaInAs. The active layer 55 of the above material is used for generating red to near infrared light of wavelength, 0.6 to 1 micrometer. In this optical semiconductor device, AlGaInP, GaInP, AlGaAs or GaInAsP can be used for the first conductive type semiconductor region 53 and the second conductive type semiconductor region 57. Since the AlGaInP has a large bandgap up to 2.3 eV depending on its composition, the first conductive type semiconductor region 53 and the second conductive type semiconductor region 57 made of AlGaInP permits the bandgap energy difference ΔEg to increase.

FIG. 14 is a view showing another modified semiconductor optical device. Area (a) in FIG. 14 shows a cross sectional view. Area (b) in FIG. 14 shows a band diagram, taken along VI—VI in area (a), for the semiconductor optical device according to this embodiment. Area (c) in FIG. 14 shows a refractive index diagram, taken along VI—VI in area (a), for the semiconductor optical device according to the present embodiment. A semiconductor optical device 51a includes first and second optical confinement layers 75 and 77. The first optical confinement layer 75 is provided between the active layer 55 and the first conductive type semiconductor region 53 and the second optical confinement layer 77 is provided between the active layer 55 and the second conductive type semiconductor region 57. The active layer 55 and the first and second optical confinement layers 75 and 77 constitute a semiconductor ridge portion 63a.

The first and second optical confinement layers 75 and 77 have the same structure and functions as the first and second optical confinement layers 25 and 27 described in the first embodiment. The first optical confinement layer 75 is made of material having a bandgap energy between that of the first conductive type semiconductor layer 53 and that of the active layer 55. The second optical confinement layer 77 is made of material having a bandgap energy between that of the second conductive type semiconductor layer 57 and that of the active layer 55. As shown in area (c) of FIG. 14, the first optical confinement layer 75 has a refractive index between that of the active layer 55 and that of the first conductive type semiconductor layer 53, and the second optical confinement layer 77 has a refractive index between that of the active layer 55 and that of the second conductive type semiconductor layer 57. Therefore, the first and second optical confinement layers 75 and 77 permit the current confinement and the optical confinement into the active layer 55 separately. These optical confinement layers 75, 77 enhance the confinement of the light into the active layer 55, which leads to the improvements of the lasing characteristics such as a threshold current reduction and a less dependence on temperature.

In the present embodiment, the first conductive type semiconductor region 53 can be made of material that functions as a etch stopper for etching active layer 55 and the first and second optical confinement layers 75 and 77. In conventional buried hetero-structures, etching the active layer into a mesa-shape is carried out using wet etching in most cases to avoid the damage of semiconductor portions. Since wet etching is, however, isotropic, the etchant etches the active layer in both horizontal and vertical directions. Consequently, the width of the active layer is varied depending on the mesa depth. For example, in the fabrication of the semiconductor laser device as described in Publication 1, etchant of Br-methanol is generally used to etch the active layer made of GaInAsP. But, the n-type InP cladding layer is etched by the etchant of Br-methanol and this etchant can etch not only the active layer but also the n-type InP cladding layer located just below the active layer. Etching rates in wet etchings are varied depending on even slight fluctuations of the etchant temperature, the etchant concentration and the mixture ratios of etchant. Especially, Br-methanol is volatile and thus the etching rate thereof is easily varied. In addition, etching rates on the wafer cannot be constant all over the surface of the wafer due to the difference of stirring speed of the etchant between the center the periphery of the wafer. Due to this variation of etching rate, the mesa depth varies in every production and all over the surface of the wafer. Consequently, the width of the active layer is also varied. Accordingly, precise control of the width of the active layer is difficult, which would affect the reproducibility and uniformity of laser characteristics.

On the other hand, since the semiconductor optical device 51 according to the present embodiment uses the GaAs substrate, AlGaInP or GaInP can be used for the first conductive type semiconductor region 53, AlGaAs, GaAs and GaInAsP can be used for the first and second optical confinement layers 75, 77 and AlGaAs, GaAs, Ga InAsP, GaInAs and III-V compound semiconductor containing at least nitrogen, gallium and arsenic can be used for the active layer 55. In this case, the first conductive type semiconductor region 53 works as an etch stopper in etchings of the active layer 55 the first and second optical confinement layers 75, 77 by use of appropriate etchant (for example, phosphoric-acid-based etchant), whereby the active layer 55 and the first and second optical confinement layers 75 and 77 are etched without etching of the first conductive type semiconductor region 53. As a result, the excellent reproducibility and uniformity of the mesa depth of the active layer 55 and the first and second optical confinement layers 75 and 77 are obtained and accordingly the better reproducibility and uniformity of the width of the active layer 55 are obtained, thereby improving the reproducibility and uniformity of laser characteristics.

Figure 15:
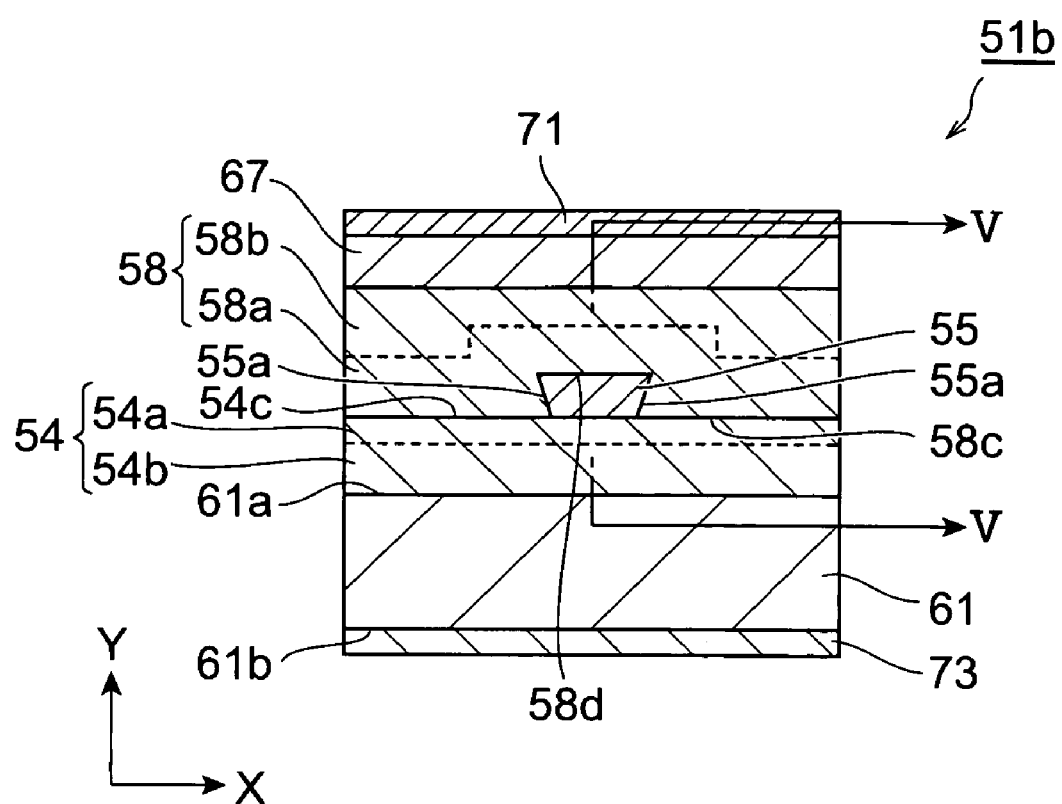
FIG. 15 is a cross sectional view showing still another modified semiconductor optical device.

FIG. 15 is a cross sectional view showing still another modified semiconductor optical device 51b. In this modified semiconductor optical device, the first conductive type semiconductor region 54 has a third region 54a and another region 54b. The second conductive type semiconductor region 58 has a fourth region 58a and another region 58b. The third region 54a of the first conductive type semiconductor region 54 has an interfacial region 54c on which the second conductive type semiconductor region 58 is provided. The fourth region 58a of the second conductive type semiconductor region 58 has an interfacial regions 58c and 58d on which the first conductive type semiconductor region 54 is provided. In the first conductive type semiconductor region 54, the dopant concentration of the third region 54a is different from that of the other region 54b. In the second conductive type semiconductor region 58, the dopant concentration of the fourth region 58a is different from that of the other region 58b.

Figure 16:
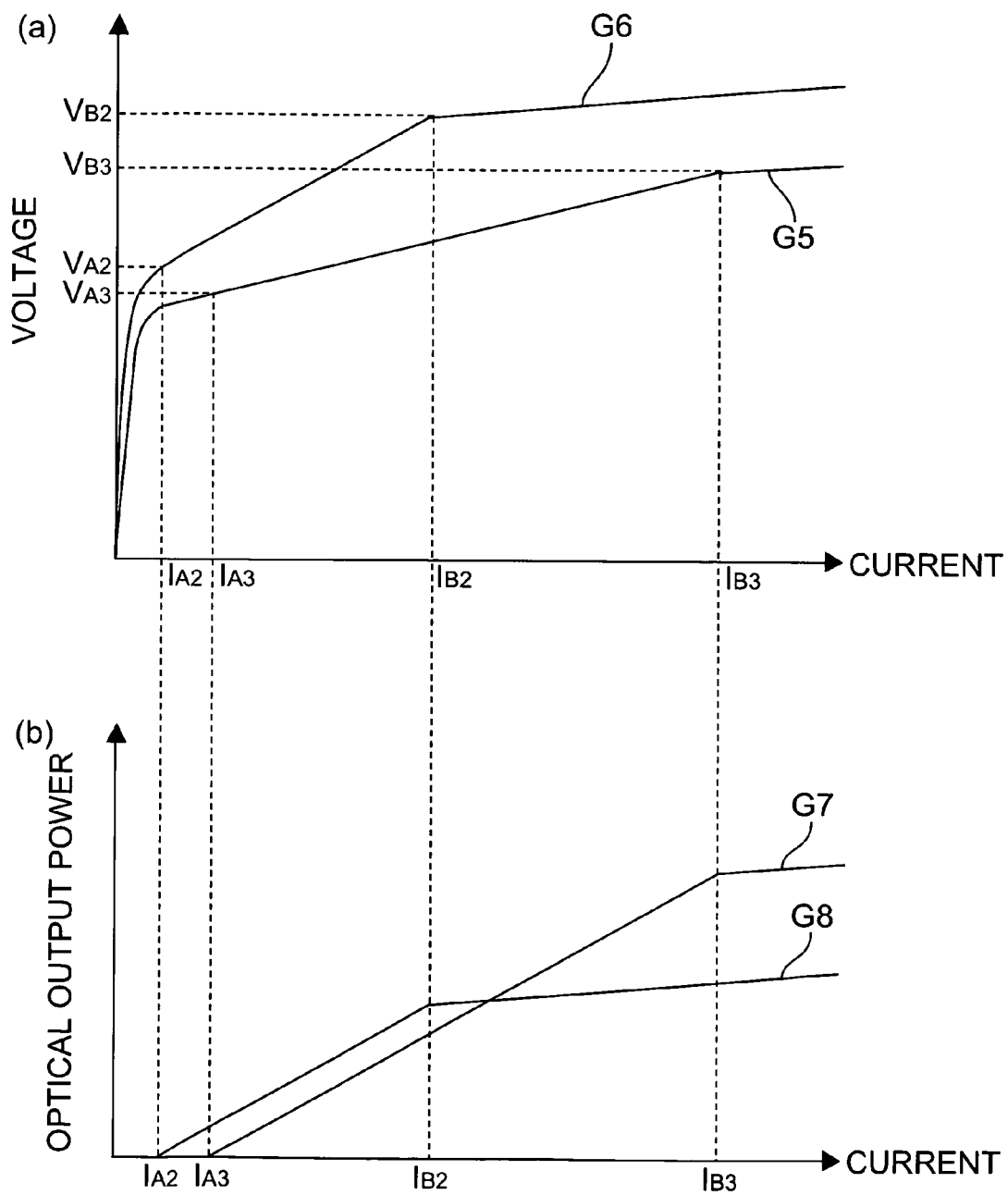
FIG. 16 shows schematically current vs. voltage and current vs. optical output power characteristics for the semiconductor optical device.

FIG. 16 schematically shows the current vs. voltage and the current vs. optical output power characteristics for the semiconductor optical device. Curve G5 in area (a) in FIG. 16 indicates a current vs. voltage relationship of the semiconductor optical device 51b. Curve G6 in area (a) in FIG. 16 indicates a current vs. voltage relationship of the semiconductor optical device, unlike in the case of the semiconductor optical device 51b, which does not have the third and the fourth regions 54a and 58a doped heavily. Curves G7 and G8 in area (b) in FIG. 16 indicate current vs. optical power that correspond to curves G5 and G6, respectively. In the semiconductor optical device 51b, since the dopant concentrations of the third region 54a and the fourth region 58a are different from those of the regions 54b and 58b, the quasi-Fermi levels and resistance values of the third region 54a and fourth region 58a are different from those of the regions 54b and 58b, respectively. Due to this difference, the turn-on voltages of the pn junction constituted by the first conductive type semiconductor region 54 and the second conductive type semiconductor region 58 and the pin junction constituted by the first conductive type semiconductor region 54, the active region 55 and the second conductive type semiconductor region 58 are changed accordingly. Furthermore, the series resistance of the semiconductor optical device 51b is also changed in the linear operation region which appears after turning on the pin junction portion. For example, if the third region 54a and fourth region 58a are doped more heavily than the regions 54b and 58b, the resistance of these cladding parts becomes low, whereby the turn-on voltages of pn junction and pin junction are lowered. As a result, as shown in areas (a) and (b), the turn-on voltage $V_{A2}$ of the pin junction portion is changed to a lower turn-on voltage $V_{A3}$ and the turn-on voltage $V_{B2}$ of the pn junction portion is changed to a lower turn-on voltage $V_{B3}$. Furthermore, since the resistance values of the third region 54a and fourth region 58a are also lowered, the slope of curve of the current vs. voltage relationship (series resistance) becomes small in the linear operation region after turning on the pin junction portion. Consequently, since the current at which the pn junction portion is turned on is increased from current $I_{B2}$ to $I_{B3}$, the width of the linear operation region in the current vs. optical power relationship is enlarged, thereby increasing the optical power. As described in above, turn-on voltages and the above series resistance values are changed by changing the dopant concentrations of the regions 54a and 58a, so that the range of the linear operation region can be changed as required. In the above example, although the dopant concentrations of both the regions 54a and 58a are changed, the dopant concentration of one of the regions 54a and 58a may be changed, thereby providing the similar advantages as above.

The turn-on voltages as above can be also changed by the change of the dopant concentration of the entire first conductive type semiconductor region 54 (and/or the entire second conductive type semiconductor region 58). Besides, the turn-on voltages can be also changed by changing the dopant concentration of only one of the first conductive type semiconductor region 54 and the second conductive type semiconductor region 58. In the above example of the optical device 51b, dopant concentration changes are performed in only necessary parts of the first conductive type semiconductor region 54 and the second conductive type semiconductor region 58. This is preferable for minimizing the degradation of other device characteristics caused by the dopant concentration change. The semiconductor optical device 1 in the first embodiment, the semiconductor optical device 51b in the present embodiment and other semiconductor optical device according to the present invention can be formed by use of the control method of changing dopant concentrations of parts or the whole of the first conductive type semiconductor region and the second conductive type semiconductor region.

Having described the first and second embodiments with reference to a number of modifications, the present invention is not limited to the above. In still another semiconductor optical device, the first conductive type semiconductor region and the second conductive type semiconductor region can be made of material not containing aluminum. If material containing aluminum is used for the first conductive type semiconductor region and/or the second conductive type semiconductor region, the interfaces among the first and second conductive type semiconductor regions and the active layer and optical confinement layers and between the first and second conductive type semiconductor regions are oxidized as time goes on, whereby the number of nonradiative recombination centers are increased. Consequently, the optical characteristics and the reliability of the semiconductor optical device are deteriorated. In addition, if the first conductive type semiconductor region is made of material containing aluminum, the surface of the first conductive type semiconductor region may be easily oxidized and it is difficult to grow the second conductive type semiconductor region thereon due to the surface oxidization. On the other hand, if the first and second conductive type semiconductor regions are made of material not containing aluminum, the generation of nonradiative recombination center at the interface regions is avoided and the second conductive type semiconductor region having excellent quality is grown thereon. Furthermore, if the second conductive type semiconductor region is made of material not containing aluminum, the contact layer and the remaining of the second conductive type semiconductor region both having excellent quality are grown thereon in the second crystal growth step. For example, GaInP and GaInAsP can be used as a material not containing aluminum.

The first conductive type semiconductor region has a part contacting the second conductive type semiconductor region (for example, the third region 54a in FIG. 15) and the second conductive type semiconductor region has a part contacting the first conductive type semiconductor region (for example, the fourth region 58a in FIG. 15). These parts can be made of material not containing aluminum. This structure provides the same advantages as those of the semiconductor optical device including the whole first conductive type semiconductor region and the whole second conductive type semiconductor region both made of material not containing aluminum. Since the parts of the first and second conductive type semiconductor regions that are not contacted with other semiconductor portions can be made of material containing aluminum, these regions can be made of material containing aluminum or not containing aluminum, which increases the flexibility in designing semiconductor optical devices. Examples of material not containing aluminum are listed as follows: GaInP, GaAs, GaInAsP, GaInAs and so on.

In addition to the above structures, the active layer and optical confinement layers may be made of material not containing aluminum. If these layers are made of material not containing aluminum, all the layers in the semiconductor optical device do not contain aluminum. Then, this semiconductor optical device is free from aluminum oxidization related matters, thereby providing the semiconductor optical device with high performance and reliability. Examples of material of the active layer are listed below: GaAs, GaInAs, GaInAsP and so on. Examples of material of the optical confinement layers are listed as follows: GaAs and GaInAsP.

If the active layer has a quantum well structure, the active layer may have a composition such that the lattice mismatch between the active layer and the substrate or base layer is from +3% to −3%. Since the thickness of the well layers can be very thin and thinner than the critical thickness, the above range of lattice mismatch does not generate crystal defects such as misfit dislocation, and a good crystaline quality can be maintained. In this case, since the restriction on the lattice match condition between the active layer and the base layer is alleviated, these layers can be made of a wider range of materials. Accordingly, the bandgap energy of the active layer can be changed more widely, leading to more flexibility in designing the semiconductor optical devices.

Having described and illustrated the principle of the invention in a preferred embodiment thereof, it is appreciated by those having skill in the art that the invention can be modified in arrangement and detail without departing from such principles. For example, the semiconductor optical device encompasses not only semiconductor lasers, but also semiconductor light-emitting diodes, semiconductor optical amplifiers, semiconductor electro-absorption modulators, semiconductor optical wave guide, semiconductor optical integrated devices and the like, as well as integrated devices integrating these devices. Details of structures of these devices can be modified as necessary. We therefore claim all modifications and variations coming within the spirit and scope of the following claims.

What is claimed is:

1. A semiconductor optical device comprising:
a first conductive type semiconductor region provided on a surface of GaAs, the first conductive type semiconductor region having a first semiconductor portion and a second semiconductor portion, the first semiconductor portion having a first region and a second region, the second semiconductor portion having a pair of sides, the second semiconductor portion being provided on the first region of the first semiconductor portion;
an active layer provided on the second semiconductor portion of the first conductive type semiconductor region, the active layer having a pair of sides; and
a second conductive type semiconductor region provided on the sides and top of the active layer, the sides of the second semiconductor portion, and the second region of the first semiconductor portion of the first conductive type semiconductor region, a bandgap energy of the first conductive type semiconductor region being greater than that of the active layer, a bandgap energy of the second conductive type semiconductor region being greater than that of the active layer, the second region of the first semiconductor portion of the first conductive type semiconductor region and the second conductive type semiconductor region constituting a pn junction.

2. The semiconductor optical device according to claim 1, wherein a bandgap energy difference between the first conductive type semiconductor region and the active layer is greater than 0.3 eV, and a bandgap energy difference between the second conductive type semiconductor region and the active layer is greater than 0.3 eV.

3. The semiconductor optical device according to claim 1, wherein the first conductive type semiconductor region is made of at least one of AlGaAs, AlGaInP, GaInP and GaInAsP,
wherein the second conductive type semiconductor region is made of at least one of AlGaAs, AlGaInP, GaInP and GaInAsP, and
wherein the active layer is made of GaInNAs.

4. The semiconductor optical device according to claim 1, further comprising a second conductive type contact layer provided on the active layer and the second conductive type semiconductor region.

5. The semiconductor optical device according to claim 1, wherein the first conductive type semiconductor region includes a third region and a fourth region, the third region and the second conductive type semiconductor region constitute the pn junction, and dopant concentration of the third region is different from that of the fourth region.

6. The semiconductor optical device according to claim 1, wherein the second conductive type semiconductor region includes a third region and a fourth region, the third region and the first conductive type semiconductor region constitute the pn junction, and dopant concentration of the third region is different from that of the fourth region.

7. The semiconductor optical device according to claim 1, further comprising:
a first optical confinement layer provided between the active layer and the first conductive type semiconductor region; and
a second optical confinement layer provided between the active layer and the second conductive type semiconductor region.

8. The semiconductor optical device according to claim 1, wherein a GaAs substrate provides the surface of GaAs.

9. The semiconductor optical device according to claim 1, wherein the semiconductor optical device includes at least one of a semiconductor laser, a light emitting diode, a semiconductor optical amplifier, an electro-absorption type modulator and a semiconductor optical waveguide.

10. A semiconductor optical device comprising:
a first conductive type semiconductor region provided on a surface of GaAs, the fist conductive type semiconductor region having a first region and a second region;
an active layer provided on the first region of the first conductive type semiconductor region, the active layer having a pair of sides; and
a second conductive type semiconductor region provided on the sides and top of the active layer, and the second region of the first conductive type semiconductor region, a bandgap energy of the first conductive type semiconductor region being greater than that of the active layer, a bandgap energy of the second conductive type semiconductor region being greater than that of the active layer, the second region of the first conductive type semiconductor region and the second conductive type semiconductor region constituting a pn junction.

11. The semiconductor optical device according to claim 10, wherein the first conductive type semiconductor region is made of material permitting the first conductive type semiconductor region to work as an etch stop layer for etching the active layer.

12. The semiconductor optical device according to claim 10, wherein a bandgap energy difference between the first conductive type semiconductor region and the active layer is greater than 0.3 eV, and a bandgap energy difference between the second conductive type semiconductor region and the active layer is greater than 0.3 eV.

13. The semiconductor optical device according to claim 10, wherein the first conductive type semiconductor region is made of at least one of AlGaAs, AlGaInP, GaInP and GaInAsP,
wherein the second conductive type semiconductor region is made of at least one of AlGaAs, AlGaInP, GaInP and GaInAsP, and
wherein the active layer is made of GaInNAs.

14. The semiconductor optical device according to claim 10, further comprising a second conductive type contact layer provided on the active layer and the second conductive type semiconductor region.

15. The semiconductor optical device according to claim 10, wherein the first conductive type semiconductor region includes a third region and a fourth region, the third region and the second conductive type semiconductor region constitute the pn junction, and dopant concentration of the third region is different from that of the fourth region.

16. The semiconductor optical device according to claim 10, wherein the second conductive type semiconductor region includes a third region and a fourth region, the third region and the first conductive type semiconductor region constitute the pn junction, and dopant concentration of the third region is different from that of the fourth region.

17. The semiconductor optical device according to claim 10, further comprising:
  a first optical confinement layer provided between the active layer and the first conductive type semiconductor region; and
  a second optical confinement layer provided between the active layer and the second conductive type semiconductor region.

18. The semiconductor optical device according to claim 10, wherein a GaAs substrate provides the surface of GaAs.

19. The semiconductor optical device according to claim 10, wherein the semiconductor optical device includes at least one of a semiconductor laser, a light emitting diode, a semiconductor optical amplifier, an electro-absorption type modulator and a semiconductor optical waveguide.

* * * * *